US012620435B2

(12) United States Patent
Kim

(10) Patent No.: US 12,620,435 B2
(45) Date of Patent: May 5, 2026

(54) SEMICONDUCTOR SYSTEM FOR INPUTTING AND OUTPUTTING DATA

(71) Applicant: SK hynix Inc., Icheon-si (KR)

(72) Inventor: Hyun Seung Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 192 days.

(21) Appl. No.: 18/479,960

(22) Filed: Oct. 3, 2023

(65) Prior Publication Data

US 2024/0420758 A1 Dec. 19, 2024

(30) Foreign Application Priority Data

Jun. 15, 2023 (KR) ........................ 10-2023-0077071

(51) Int. Cl.
*G11C 11/4096* (2006.01)
*G11C 11/4076* (2006.01)
*G11C 11/4093* (2006.01)

(52) U.S. Cl.
CPC ...... *G11C 11/4096* (2013.01); *G11C 11/4076* (2013.01); *G11C 11/4093* (2013.01)

(58) Field of Classification Search
CPC ............ G11C 11/4096; G11C 11/4076; G11C 11/4093
USPC .................................................. 365/189.011
See application file for complete search history.

(56) References Cited

U.S. PATENT DOCUMENTS

| | | | | |
|---|---|---|---|---|
| 6,240,046 B1* | 5/2001 | Proebsting | .......... | G11C 11/4091 |
| | | | | 365/233.17 |
| 2014/0156213 A1* | 6/2014 | Lee | ........................ | G11C 7/062 |
| | | | | 702/120 |
| 2020/0227129 A1* | 7/2020 | Kim | ..................... | G11C 29/023 |
| 2022/0366950 A1 | 11/2022 | Chen et al. | | |
| 2024/0096404 A1* | 3/2024 | Cho | ..................... | G11C 11/4093 |

FOREIGN PATENT DOCUMENTS

KR        1020130022228 A        3/2013

* cited by examiner

*Primary Examiner* — Anthan Tran
*Assistant Examiner* — Duy H Luong
(74) *Attorney, Agent, or Firm* — WILLIAM PARK AND ASSOCIATES LTD.

(57) ABSTRACT

A data input and output circuit includes a data input circuit configured to precharge first and second input and output lines after the end of a power-up operation and configured to generate first and second input data by driving the first and second input and output lines from each of which transfer data having a set logic level, among first and second transfer data, are output after the start of a write operation. The data input and output circuit also includes a data output circuit configured to generate first and second internal data based on logic levels of the first and second input data.

24 Claims, 21 Drawing Sheets

SEMICONDUCTOR SYSTEM FOR INPUTTING AND OUTPUTTING DATA

CROSS-REFERENCE TO RELATED APPLICATION

The present application claims priority under 35 U.S.C. § 119(a) to Korean Patent Application No. 10-2023-0077071, filed in the Korean Intellectual Property Office on Jun. 15, 2023, the entire disclosure of which is incorporated herein by reference.

BACKGROUND

The present disclosure relates to a semiconductor system for inputting and outputting data through multiple lines.

In general, a semiconductor device including double data rate synchronous DRAM (DDR SDRAM) performs a read operation and write operation on data in response to a command that is input from an external chipset. The semiconductor device inputs and outputs data by using multiple input and output lines to perform the read operation and the write operation. As a process of manufacturing the semiconductor device becomes fine, an interval between the multiple input and output lines is implemented very narrowly. As the interval between multiple input and output lines becomes very narrow, an interference phenomenon between the input and output lines occurs. An error in which the logic level of data is not transitioned or the transition of the logic level of data becomes slow when intervals of time at which two input and output lines that are adjacent to each other are toggled are the same may occur. Various methods for preventing such an error of the level transition of data are required.

SUMMARY

In an embodiment, a data input and output circuit may include: a data input circuit configured to precharge first and second input and output lines after the end of a power-up operation and configured to generate first and second input data by driving the first and second input and output lines from each of which transfer data having a set logic level, among first and second transfer data, are output after the start of a write operation; and a data output circuit configured to generate first and second internal data based on logic levels of the first and second input data.

In an embodiment, a semiconductor system may include: a controller configured to drive first and second transmission lines to a first logic level after the start of an initialization operation and configured to output first and second data by driving the first and second transmission lines from each of which pre-data having a second logic level, among first and second pre-data, are output after the start of a write operation; and a semiconductor device configured to drive first and second input and output lines to the first logic level after the end of a power-up operation, configured to generate first and second internal data by driving the first and second input and output lines from each of which transfer data having the second logic level, among first and second transfer data that are generated from the first and second data, are output after the start of the write operation, and configured to store the first and second internal data.

In an embodiment, a semiconductor system may include: a controller configured to output a clock and a command address and configured to output first and second data in series; and a semiconductor device configured to drive first and second input and output lines to a first logic level after the end of a power-up operation, configured to generate first and second alignment data by parallelizing first and second data based on the command address after the start of a write operation, configured to generate first and second internal data by driving the first and second input and output lines from each of which alignment data having a second logic level, among the first and second alignment data, are output, and configured to store the first and second internal data.

BRIEF DESCRIPTION OF THE DRAWINGS

FIG. 3 is a circuit diagram illustrating a construction according to an embodiment of a first transmitter that is included in the transmission circuit illustrated in FIG. 2.

FIG. 4 is a circuit diagram illustrating a construction according to another embodiment of the first transmitter that is included in the transmission circuit illustrated in FIG. 2.

FIG. 6 is a timing diagram for describing an operation of the first transmitter illustrated in FIG. 3.

FIG. 7 is a timing diagram for describing an operation of the transmission circuit illustrated in FIG. 1.

FIG. 19 is a block diagram illustrating a construction of a semiconductor system according to another embodiment of the present disclosure.

DETAILED DESCRIPTION

In the descriptions of the following embodiments, the term "preset" indicates that a numerical value of a parameter is previously decided, when the parameter is used in a process or algorithm. According to different embodiments, the numerical value of the parameter may be set before the process or algorithm is started, when the process or algorithm is started, or while the process or algorithm is being performed.

Terms such as "first" and "second," which are used to distinguish among various components and not to indicate an order or number of components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. In contrast, when one component is referred to as being "directly coupled" or "directly connected" to another component, it should be understood that the components are directly coupled or connected to each other without another component interposed therebetween.

A "logic high level" and a "logic low level" are used to describe the logic levels of signals. A signal having a "logic high level" is distinguished from a signal having a "logic low level." For example, when a signal having a first voltage corresponds to a signal having a "logic high level," a signal having a second voltage may correspond to a signal having a "logic low level." According to an embodiment, a "logic high level" may be set to a voltage higher than a "logic low level." According to an embodiment, the logic levels of signals may be set to different logic levels or opposite logic levels. For example, a signal having a logic high level may be set to have a logic low level in some embodiments, and a signal having a logic low level may be set to have a logic high level in some embodiments.

Hereafter, the present disclosure will be described in more detail through presented embodiments. The presented embodiments are only used to exemplify the present disclosure, and the scope of the present disclosure is not limited by the presented embodiments.

Various embodiments of the present disclosure provide a semiconductor system for inputting and outputting data by driving adjacent lines to the same logic level prior to a time at which data loaded onto the adjacent lines are toggled.

According to some embodiments of the present disclosure, it is possible to prevent an error of the level transition of data, which is attributable to an interference phenomenon at a time at which data are toggled, by driving adjacent lines to the same logic level prior to a time at which the data loaded onto the adjacent lines are toggled.

Figure 1:
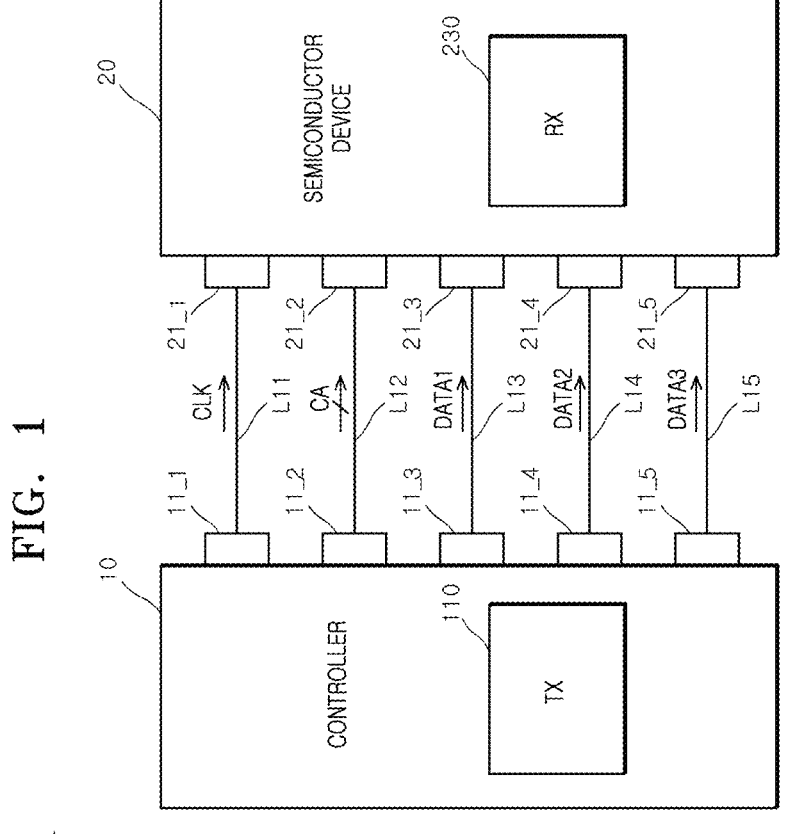
FIG. 1 is a block diagram illustrating a construction of a semiconductor system according to an embodiment of the present disclosure.

As illustrated in FIG. 1, a semiconductor system 1 according to an embodiment of the present disclosure may include a controller 10 and a semiconductor device 20. The controller 10 may include a transmission circuit (TX) 110. The semiconductor device 20 may include a reception circuit (RX) 230.

The controller 10 may include a first control pin 11_1, a second control pin 11_2, a third control pin 11_3, a fourth control pin 11_4, and a fifth control pin 11_5. The semiconductor device 20 may include a first device pin 21_1, a second device pin 21_2, a third device pin 21_3, a fourth device pin 21_4, and a fifth device pin 21_5. A first transmission line L11 may be connected between the first control pin 11_1 and the first device pin 21_1. A second transmission line L12 may be connected between the second control pin 11_2 and the second device pin 21_2. A third transmission line L13 may be connected between the third control pin 11_3 and the third device pin 21_3. A fourth transmission line L14 may be connected between the fourth control pin 11_4 and the fourth device pin 21_4. A fifth transmission line L15 may be connected between the fifth control pin 11_5 and the fifth device pin 21_5.

The controller 10 may transmit a clock CLK for controlling the semiconductor device 20 to the semiconductor device 20 through the first transmission line L11. The controller 10 may transmit a command address CA for controlling the semiconductor device 20 to the semiconductor device 20 through the second transmission line L12. The controller 10 may transmit first data DATA1 to the semiconductor device 20 through the third transmission line L13. The controller 10 may transmit second data DATA2 to the semiconductor device 20 through the fourth transmission line L14. The controller 10 may transmit third data DATA3 to the semiconductor device 20 through the fifth transmission line L15. The clock CLK may be set as a signal that is periodically toggled to synchronize operations of the controller 10 and the semiconductor device 20. The command address CA may include multiple bits, and may be set as a signal including a command and an address for controlling an operation of the semiconductor device 20.

The transmission circuit 110 may drive the third transmission line L13, the fourth transmission line L14, and the fifth transmission line L15 to a first logic level (i.e., a logic high level) after the start of an initialization operation. The transmission circuit 110 may output the first data DATA1, the second data DATA2, and the third data DATA3 by driving the third transmission line L13, the fourth transmission line L14, and the fifth transmission line L15 from which the first data DATA1, the second data DATA2, and the third data DATA3 each having a second logic level (i.e., a logic low level) are output, respectively, among the third transmission line L13, the fourth transmission line L14, and the fifth transmission line L15 after the start of a write operation. For example, the transmission circuit 110 may output the second data DATA2 by driving, to the second logic level (i.e., a logic low level), the fourth transmission line L14 that has been driven to the first logic level (i.e., a logic high level), in an initialization operation when the second data DATA2 having the second logic level (i.e., a logic low level) is output after the start of a write operation. The initialization operation may be set as an operation of preparing a write operation before the controller 10 and the semiconductor device 20 perform the write operation.

The reception circuit 230 may generate first transfer data (TD1 in FIG. 8), second transfer data (TD2 in FIG. 8), and third transfer data (TD3 in FIG. 8) by receiving the first data DATA1, the second data DATA2, and the third data DATA3 after the start of a write operation.

The semiconductor device 20 may drive a first input and output line (GIO1 in FIG. 13), a second input and output line (GIO2 in FIG. 13), and a third input and output line (GIO3 in FIG. 13) to the first logic level (i.e., a logic high level) after the end of a power-up operation. The semiconductor device 20 may perform a write operation based on the command address CA in synchronization with the clock CLK. The semiconductor device 20 may generate the first transfer data (TD1 in FIG. 8), the second transfer data (TD2 in FIG. 8), and the third transfer data (TD3 in FIG. 8) by receiving the first data DATA1, the second data DATA2, and the third data DATA3 after the start of a write operation. The semiconductor device 20 may generate first internal data (ID1 in FIG. 8), second internal data (ID2 in FIG. 8), and third internal data (ID3 in FIG. 8) by driving the first input and output line (GIO1 in FIG. 13), the second input and output line (GIO2 in FIG. 13), and the third input and output line (GIO3 in FIG. 13) from each of which transfer data having the second logic level (i.e., a logic low level), among the first transfer data (TD1 in FIG. 8), the second transfer data (TD2 in FIG. 8), and the third transfer data (TD3 in FIG. 8), are output after the start of a write operation. The semiconductor device 20 may store the first internal data (ID1 in FIG. 8), the second internal data (ID2 in FIG. 8), and the third internal data (ID3 in FIG. 8) after the start of a write operation.

Figure 2:
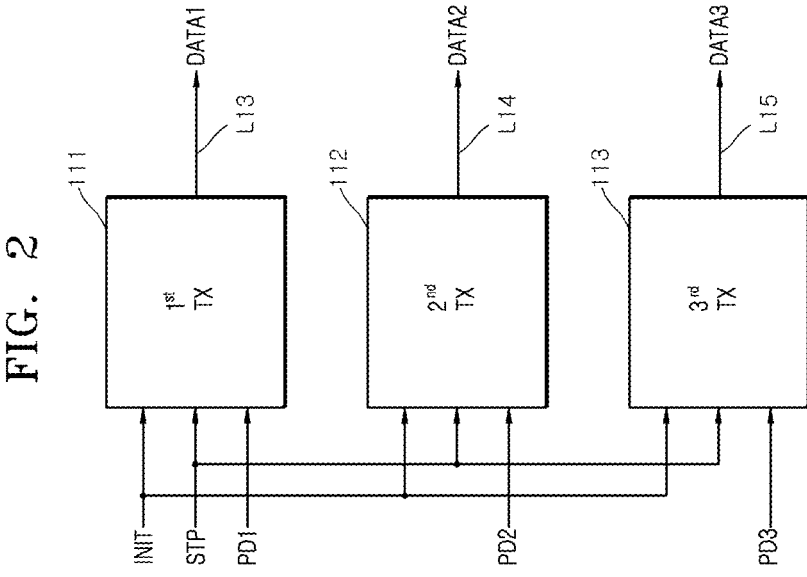
FIG. 2 is a block diagram illustrating a construction according to an embodiment of a transmission circuit that is included in the semiconductor system illustrated in FIG. 1.

As illustrated in FIG. 2, the transmission circuit 110 according to an embodiment of the present disclosure may include a first transmitter ($1^{st}$ TX) 111, a second transmitter ($2^{nd}$ TX) 112, and a third transmitter ($3^{rd}$ TX) 113.

The first transmitter 111 may drive the third transmission line L13 to the first logic level (i.e., a logic high level) after the start of an initialization operation. The first transmitter 111 may drive the third transmission line L13 to the first logic level (i.e., a logic high level) when the initialization signal INIT is enabled. The first transmitter 111 may drive the third transmission line L13 to the second logic level (i.e., a logic low level) when first pre-data PD1 having the second logic level (i.e., a logic low level) is input after the start of a write operation. The first transmitter 111 may drive, to the second logic level (i.e., a logic low level), the third transmission line L13 that has been driven to the first logic level (i.e., a logic high level), when the first pre-data PD1 having the second logic level (i.e., a logic low level) is input in synchronization with the strobe pulse STP after the start of a write operation. The first transmitter 111 may output the first data DATA1 having the second logic level (i.e., a logic low level) by driving the third transmission line L13 to the second logic level (i.e., a logic low level). The first transmitter 111 may be implemented to drive the third transmission line L13 to the second logic level (i.e., a logic low level) after the start of an initialization operation according to an embodiment. The first transmitter 111 may drive, to the first logic level (i.e., a logic high level), the third transmission line L13 that has been driven to the second logic level (i.e., a logic low level), when the first pre-data PD1 having the first logic level (i.e., a logic high level) is input after the start of a write operation according to an embodiment. The first transmitter 111 may output the first data DATA1 having the first logic level (i.e., a logic high level) by driving the third transmission line L13 to the first logic level (i.e., a logic high level) according to an embodiment.

The second transmitter 112 may drive the fourth transmission line L14 to the first logic level (i.e., a logic high level) after the start of an initialization operation. The second transmitter 112 may drive the fourth transmission line L14 to the first logic level (i.e., a logic high level) when an initialization signal INIT is enabled. The second transmitter 112 may drive the fourth transmission line L14 to the second logic level (i.e., a logic low level) when second pre-data PD2 having the second logic level (i.e., a logic low level) is input after the start of a write operation. The second transmitter 112 may drive, to the second logic level (i.e., a logic low level), the fourth transmission line L14 that has been driven to the first logic level (i.e., a logic high level), when the second pre-data PD2 having the second logic level (i.e., a logic low level) is input in synchronization with the strobe pulse STP after the start of a write operation. The second transmitter 112 may output the second data DATA2 having the second logic level (i.e., a logic low level) by driving the fourth transmission line L14 to the second logic level (i.e., a logic low level). The second transmitter 112 may be implemented to drive the fourth transmission line L14 to the second logic level (i.e., a logic low level) after the start of an initialization operation according to an embodiment. The second transmitter 112 may drive, to the first logic level (i.e., a logic high level), the fourth transmission line L14 that has been driven to the second logic level (i.e., a logic low level), when the second pre-data PD2 having the first logic level (i.e., a logic high level) is input after the start of a write operation according to an embodiment. The second transmitter 112 may output the second data DATA2 having the first logic level (i.e., a logic high level) by driving the fourth transmission line L14 to the first logic level (i.e., a logic high level) according to an embodiment.

The third transmitter 113 may drive the fifth transmission line L15 to the first logic level (i.e., a logic high level) after the start of an initialization operation. The third transmitter 113 may drive the fifth transmission line L15 to the first logic level (i.e., a logic high level) when the initialization signal INIT is enabled. The third transmitter 113 may drive the fifth transmission line L15 to the second logic level (i.e., a logic low level) when third pre-data PD3 having the second logic level (i.e., a logic low level) is input after the start of a write operation. The third transmitter 113 may drive, to the second logic level (i.e., a logic low level), the fifth transmission line L15 that has been driven to the first logic level (i.e., a logic high level), when the third pre-data PD3 having the second logic level (i.e., a logic low level) is input in synchronization with the strobe pulse STP after the start of a write operation. The third transmitter 113 may output the third data DATA3 having the second logic level (i.e., a logic low level) by driving the fifth transmission line L15 to the second logic level (i.e., a logic low level). The third transmitter 113 may be implemented to drive the fifth transmission line L15 to the second logic level (i.e., a logic low level) after the start of an initialization operation according to an embodiment. The third transmitter 113 may drive, to the first logic level (i.e., a logic high level), the fifth transmission line L15 that has been driven to the second logic level (i.e., a logic low level) when the third pre-data PD3 having the first logic level (i.e., a logic high level) is input after the start of a write operation according to an embodiment. The third transmitter 113 may output the third data DATA3 having the first logic level (i.e., a logic high level) by driving the fifth transmission line L15 to the first logic level (i.e., a logic high level) according to an embodiment.

The first transmitter 111, the second transmitter 112, and the third transmitter 113 have been implemented to drive the third transmission line L13, the fourth transmission line L14, and the fifth transmission line L15, respectively, to the first logic level (i.e., a logic high level) after the start of an initialization operation, but may be implemented to drive the third transmission line L13, the fourth transmission line L14, and the fifth transmission line L15, respectively, to the second logic level (i.e., a logic low level).

Figure 3:
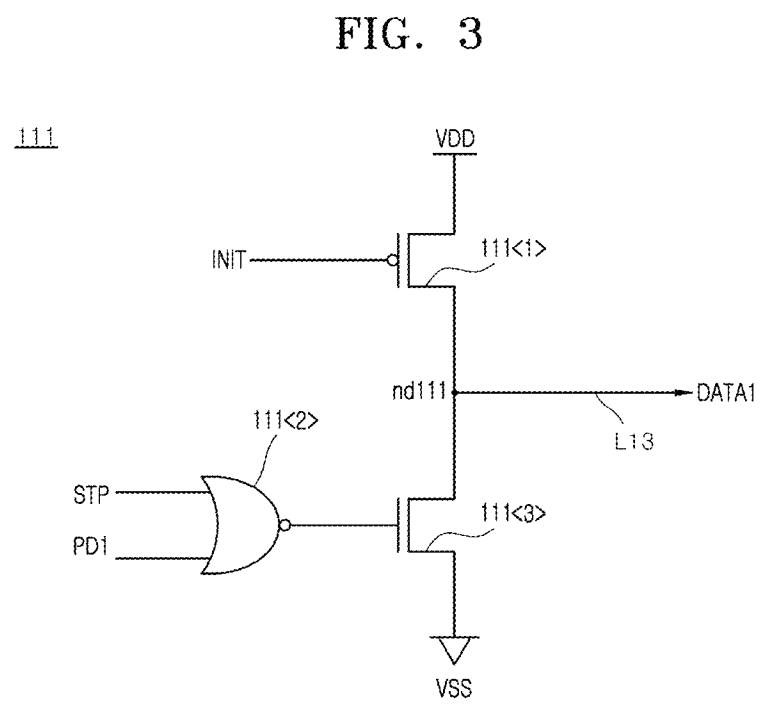

As illustrated in FIG. 3, the first transmitter 111 according to an embodiment of the present disclosure may be implemented by using a pull-up driving element 111<1>, a NOR gate 111<2>, and a pull-down driving element 111<3>.

The pull-up driving element 111<1> may be implemented by using a PMOS transistor. The pull-up driving element 111<1> may be disposed between a power supply voltage VDD and a node nd111. The pull-up driving element 111<1> may drive the third transmission line L13 to a logic high level by driving the node nd111 to the level of the power supply voltage VDD when the initialization signal INIT is enabled to a logic low level. The initialization signal INIT may be set as a signal including a pulse that is enabled to a logic low level in an initialization operation before the controller 10 and the semiconductor device 20 perform a write operation.

The NOR gate 111<2> may output the strobe pulse STP and the first pre-data PD1 by performing a NOR operation on the strobe pulse STP and the first pre-data PD1. The NOR gate 111<2> may generate an output signal having a logic high level, when the strobe pulse STP is enabled to a logic low level and the first pre-data PD1 has a logic low level. The strobe pulse STP may be set as a signal including a pulse that is enabled to a logic low level in a write operation.

The pull-down driving element 111<3> may be implemented by using an NMOS transistor. The pull-down driving element 111<3> may be disposed between the node nd111 and a ground voltage VSS. The pull-down driving element 111<3> may drive the third transmission line L13 to a logic low level by driving the node nd111 to the level of the ground voltage VSS when the output signal of the NOR gate 111<2> is enabled to a logic high level.

Each of the second transmitter 112 and the third transmitter 113 illustrated in FIG. 2 may be implemented to have the same circuit as the first transmitter 111 illustrated in FIG. 3 and may perform the same operation as the first transmitter 111 illustrated in FIG. 3 except input and output signals for each of the second transmitter 112 and the third transmitter 113, and thus a detailed description thereof is omitted.

Figure 4:
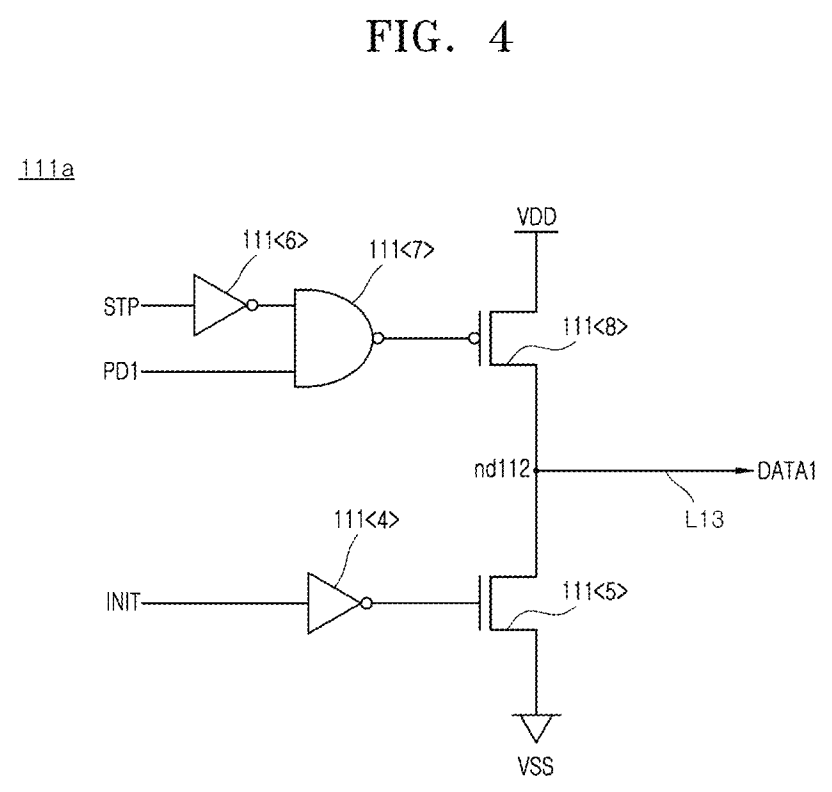

As illustrated in FIG. 4, a first transmitter 111a according to another embodiment of the present disclosure may be implemented by using an inverter 111<4>, a pull-down driving element 111<5>, an inverter 111<6>, a NAND gate 111<7>, and a pull-up driving element 111<8>.

The inverter 111<4> may output the initialization signal INIT by inverting and buffering the initialization signal INIT.

The pull-down driving element 111<5> may be implemented by using an NMOS transistor. The pull-down driving element 111<5> may be disposed between a node nd112 and a ground voltage VSS. The pull-down driving element 111<5> may drive the third transmission line L13 to a logic low level by driving the node nd112 to the level of the ground voltage VSS when the output signal of the inverter 111<4> is enabled to a logic high level. The initialization signal INIT may be set as a signal including a pulse that is enabled to a logic low level in an initialization operation before the controller 10 and the semiconductor device 20 perform a write operation.

The inverter 111<6> may output the strobe pulse STP by inverting and buffering the strobe pulse STP. The strobe pulse STP may be set as a signal including a pulse that is enabled to a logic low level in a write operation.

The NAND gate 111<7> may output the output signal of the inverter 111<6> and the first pre-data PD1 by performing a NAND operation on the output signal of the inverter 111<6> and the first pre-data PD1. The NAND gate 111<7> may generate an output signal having a logic low level, when the output signal of the inverter 111<6> is enabled to a logic high level and the first pre-data PD1 has a logic high level.

The pull-up driving element 111<8> may be implemented by using a PMOS transistor. The pull-up driving element 111<8> may be disposed between a power supply voltage VDD and the node nd112. The pull-up driving element 111<8> may drive the third transmission line L13 to a logic high level by driving the node nd112 to the level of the power supply voltage VDD when the output signal of the NAND gate 111<7> is enabled to a logic low level.

Each of the second transmitter 112 and the third transmitter 113 illustrated in FIG. 2 may be implemented to have the same circuit as the first transmitter 111a illustrated in FIG. 4 and may perform the same operation as the first transmitter 111a illustrated in FIG. 4 except input and output signals for each of the second transmitter 112 and the third transmitter 113, and thus a detailed description thereof is omitted.

Figure 5:
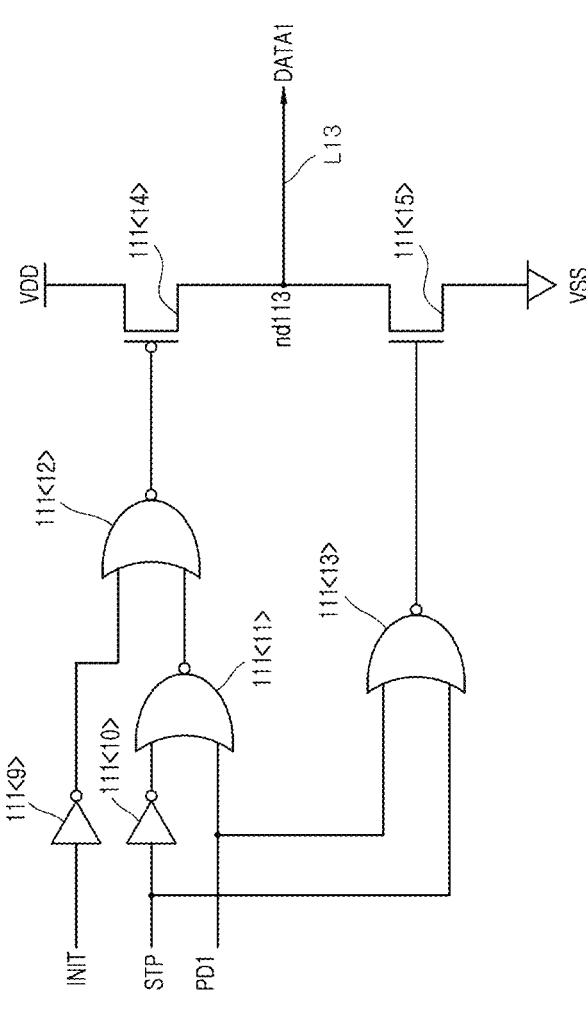
FIG. 5 is a circuit diagram illustrating a construction according to still another embodiment of the first transmitter that is included in the transmission circuit illustrated in FIG. 2.

As illustrated in FIG. 5, a first transmitter 111b according to another embodiment of the present disclosure may be implemented by using inverters 111<9> and 111<10>, NOR gates 111<11>, 111<12>, and 111<13>, a pull-up driving element 111<14>, and a pull-down driving element 111<15>.

The inverter 111<9> may output the initialization signal INIT by inverting and buffering the initialization signal INIT.

The inverter 111<10> may output the first pre-data PD1 by inverting and buffering the first pre-data PD1.

The NOR gate 111<11> may output the output signal of the inverter 111<10> by inverting and buffering the output signal of the inverter 111<10> when the strobe pulse STP has a logic low level. The NOR gate 111<11> may generate an output signal having a logic low level when the strobe pulse STP has a logic high level.

The NOR gate 111<12> may generate an output signal having a logic low level when the output signal of the inverter 111<9> has a logic high level. The NOR gate 111<12> may output the output signal of the NOR gate 111<11> by inverting and buffering the output signal of the NOR gate 111<11> when the output signal of the inverter 111<9> has a logic low level.

The NOR gate 111<13> may output the first pre-data PD1 by inverting and buffering the first pre-data PD1 when the strobe pulse STP has a logic low level. The NOR gate 111<13> may generate an output signal having a logic low level when the strobe pulse STP has a logic high level.

The pull-up driving element 111<14> may be implemented by using a PMOS transistor. The pull-up driving element 111<14> may be disposed between a power supply voltage VDD and a node nd113. The pull-up driving element 111<14> may drive the third transmission line L13 to a logic high level by driving the node nd113 to the level of the power supply voltage VDD when the output signal of the NOR gate 111<12> is enabled to a logic low level. The pull-up driving element 111<14> may drive the third transmission line L13 to a logic high level when the initialization signal INIT has a logic low level after the start of an initialization operation. The pull-up driving element 111<14> may drive the third transmission line L13 to a logic high level, when the strobe pulse STP has a logic low level and the first pre-data PD1 has a logic high level after an initialization operation.

The pull-down driving element 111<15> may be implemented by using an NMOS transistor. The pull-down driving element 111<15> may be disposed between the node nd113 and a ground voltage VSS. The pull-down driving element 111<5> may drive the third transmission line L13 to a logic low level by driving the node nd113 to the level of the ground voltage VSS when the output signal of the NOR gate 111<13> is enabled to a logic high level. The initialization signal INIT may be set as a signal including a pulse that is enabled to a logic low level in an initialization operation before the controller 10 and the semiconductor device 20 perform a write operation.

Figure 6:
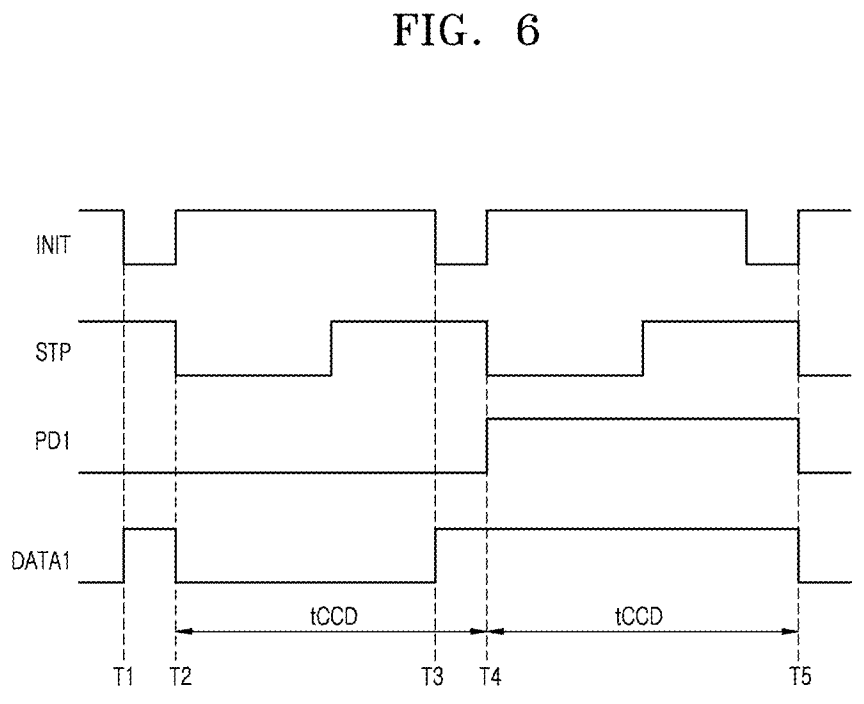

FIG. 6 is a timing diagram for describing an operation of the first transmitter 111 illustrated in FIG. 3. An initialization operation and a write operation are described with reference to FIG. 6, but a case in which the first pre-data PD1 has the second logic level (i.e., a logic low level) and a case in which the first pre-data PD1 has the first logic level (i.e., a logic high level) after the start of a write operation is described as an example as follows.

First, a case in which the first pre-data PD1 has the second logic level (i.e., a logic low level) during a set interval tCCD is described as follows. The set interval tCCD may be set as an interval from a time at which the first command is input and a column operation is performed after the start of consecutive write operations to a time at which the second command is input and a column operation is performed. The first set interval tCCD may be set as an interval from time T2 to time T4.

At time T1, the first transmitter 111 may output the first data DATA1 having a logic high level by driving the third transmission line L13 to a logic high level when the initialization signal INIT is enabled to a logic low level after the start of an initialization operation.

At time T2, the first transmitter 111 may output the first data DATA1 having a logic low level by driving the third transmission line L13 to a logic low level when the strobe pulse STP is enabled to a logic low level and the first pre-data PD1 has a logic low level after the start of a write operation.

At time T3, the first transmitter 111 may output the first data DATA1 having a logic high level by driving the third transmission line L13 to a logic high level when the initialization signal INIT is enabled to a logic low level after the start of an initialization operation.

Next, a case in which the first pre-data PD1 has a logic high level during a set interval tCCD is described as follows. The second set interval tCCD may be set as an interval from time T4 to time T5.

At time T4, the first transmitter 111 may output the first data DATA1 having a logic high level because the first transmitter 111 does not drive the third transmission line L13 to a logic low level, when the strobe pulse STP is enabled to a logic low level and the first pre-data PD1 has a logic high level after the start of a write operation. The first transmitter 111 may output the first data DATA1 having a logic high level up to time T5.

The first transmitter 111 according to an embodiment of the present disclosure may drive the third transmission line L13 to the first logic level (i.e., a logic high level) after the start of an initialization operation. The first transmitter 111 may drive, to the second logic level (i.e., a logic low level), the third transmission line L13 that has been driven to the first logic level (i.e., a logic high level), when the first pre-data PD1 having the second logic level (i.e., a logic low level) is input after the start of a write operation.

Figure 7:
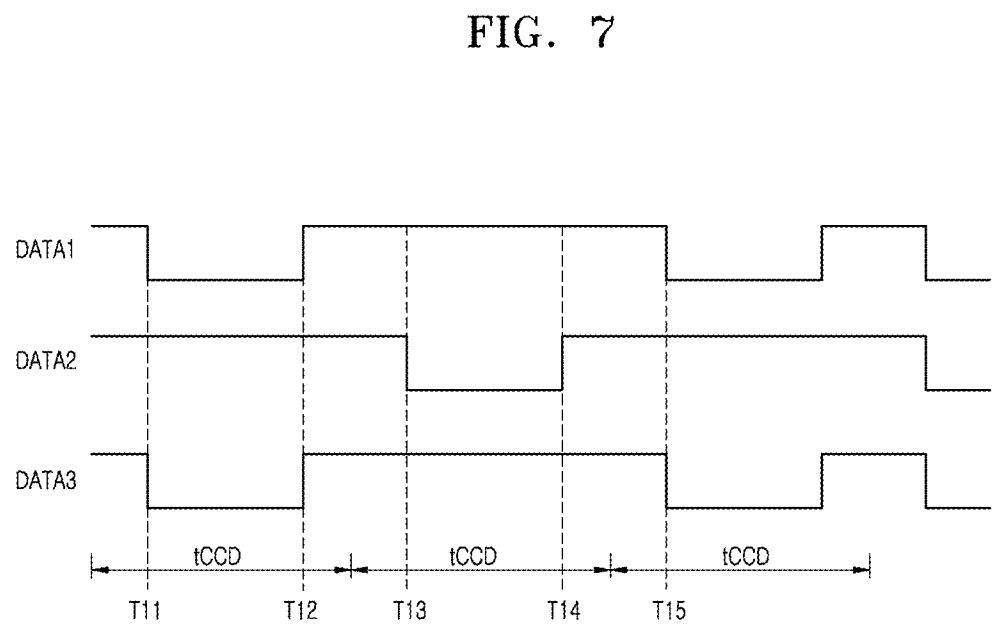

FIG. 7 is a timing diagram for describing an operation of the transmission circuit illustrated in FIG. 1.

A write operation according to an embodiment of the present disclosure is described with reference to FIG. 7, but an operation of the first data DATA1 having a logic low level L, the second data DATA2 having a logic high level H, and the third data DATA3 having a logic low level L being output during the first set interval tCCD and an operation of the first data DATA1 having a logic high level H, the second data DATA2 having a logic low level L, and the third data DATA3 having a logic high level H being output during the second set interval tCCD are described as an example as follows.

Prior to a description, after the start of an initialization operation, the first transmitter 111 may output the first data DATA1 having a logic high level by driving the third transmission line L13 to a logic high level. The second transmitter 112 may output the second data DATA2 having a logic high level by driving the fourth transmission line L14 to a logic high level. The third transmitter 113 may output the third data DATA3 having a logic high level by driving the fifth transmission line L15 to a logic high level.

First, the operation of the first data DATA1 having a logic low level L, the second data DATA2 having a logic high level H, and the third data DATA3 having a logic low level L being output during the first set interval tCCD is described as follows.

At time T11, the first transmitter 111 may output the first data DATA1 having a logic low level by driving the third transmission line L13 to a logic low level when the first pre-data PD1 having a logic low level is input after the start of a write operation. The second transmitter 112 might not drive the fourth transmission line L14 to a logic low level when the second pre-data PD2 having a logic high level is input after the start of the write operation. The third transmitter 113 may output the third data DATA3 having a logic low level by driving the fifth transmission line L15 to a logic low level when the third pre-data PD3 having a logic low level is input after the start of the write operation.

At time T12, the first transmitter 111 may output the first data DATA1 having a logic high level by driving the third transmission line L13 to a logic high level after the start of an initialization operation. The second transmitter 112 may output the second data DATA2 having a logic high level by driving the fourth transmission line L14 to a logic high level after the start of the initialization operation. The third transmitter 113 may output the third data DATA3 having a logic high level by driving the fifth transmission line L15 to a logic high level after the start of the initialization operation.

Next, the operation of the first data DATA1 having a logic high level H, the second data DATA2 having a logic low level L, and the third data DATA3 having a logic high level H being output during the second set interval tCCD is described as follows.

At time T13, the first transmitter 111 might not drive the third transmission line L13 to a logic low level when the first pre-data PD1 having a logic high level is input after the start of a write operation. The second transmitter 112 may output the second data DATA2 having a logic low level by driving the fourth transmission line L14 to a logic low level when the second pre-data PD2 having a logic low level is input after the start of the write operation. The third transmitter 113 might not drive the fifth transmission line L15 to a logic low level when the third pre-data PD3 having a logic low level is input after the start of the write operation.

At time T14, the first transmitter 111 may output the first data DATA1 having a logic high level by driving the third transmission line L13 to a logic high level after the start of an initialization operation. The second transmitter 112 may output the second data DATA2 having a logic high level by driving the fourth transmission line L14 to a logic high level after the start of the initialization operation. The third transmitter 113 may output the third data DATA3 having a logic high level by driving the fifth transmission line L15 to a logic high level after the start of the initialization operation.

An operation of each of the first transmitter 111, the second transmitter 112, and the third transmitter 113 when each of the first transmitter 111, the second transmitter 112, and the third transmitter 113 is implemented like the first transmitter 111b illustrated in FIG. 5 is described as follows.

At time T15, the first transmitter 111 may output the first data DATA1 having a logic low level by driving the third transmission line L13 to a logic low level after the initialization operation. The second transmitter 112 may output the second data DATA2 having a logic high level by driving the fourth transmission line L14 to a logic high level when the second pre-data PD2 has a logic high level after the initialization operation. The third transmitter 113 may output the third data DATA3 having a logic low level by driving the fifth transmission line L15 to a logic low level after the initialization operation. That is, the second transmitter 112 can prevent an error of the level transition of data, which is attributable to an interference phenomenon at a time at which data are toggled, by driving the second transmission line L14 to a logic high level when the third transmission line L13 and the fifth transmission line L15 are driven to a logic low level. The first transmitter 111, the second transmitter 112, and the third transmitter 113 can prevent an error of the level transition of data, which is attributable to an interference phenomenon at a time at which data are toggled, by driving the third transmission line L13, the fourth transmission line L14, and the fifth transmission line L15 that are adjacent to each other to the same logic level prior to the time at which the data loaded onto the third transmission line L13, the fourth transmission line L14, and the fifth transmission line L15 that are adjacent to each other are toggled.

Figure 8:
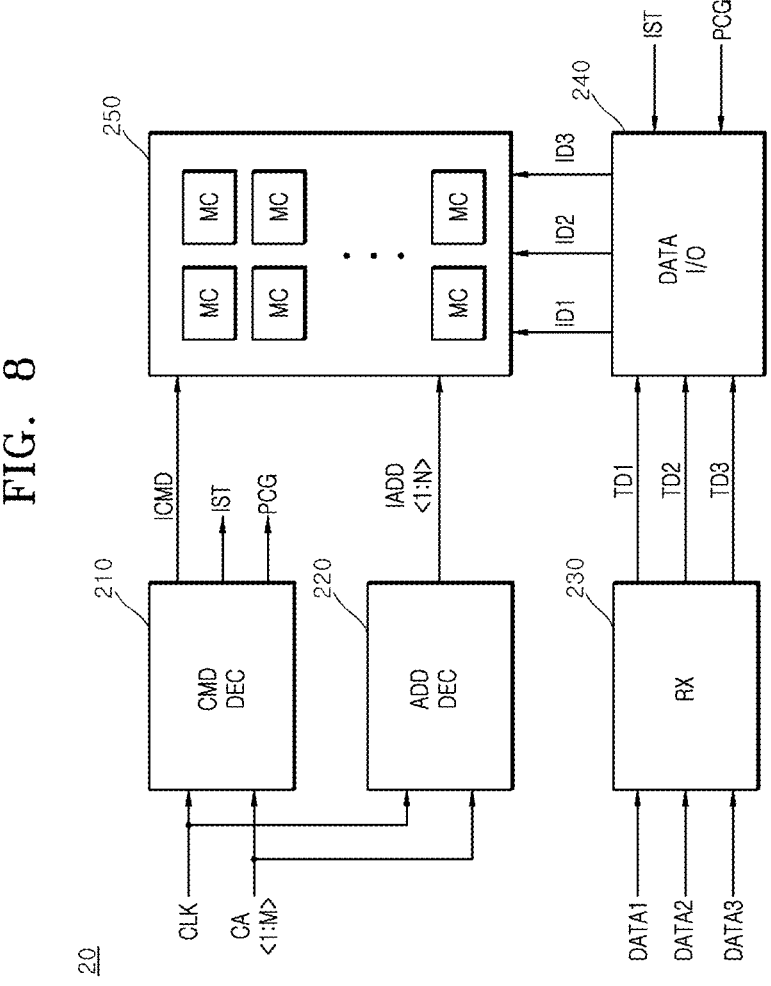
FIG. 8 is a block diagram illustrating a construction according to an embodiment of a semiconductor device that is included in the semiconductor system illustrated in FIG. 1.

As illustrated in FIG. 8, the semiconductor device 20 according to an embodiment of the present disclosure may include a command decoder (CMD DEC) 210, an address decoder (ADD DEC) 220, a reception circuit (RX) 230, a data input and output circuit (DATA I/O) 240, and a memory circuit 250.

The command decoder 210 may generate a precharge signal PCG that is enabled after the end of a power-up operation. The command decoder 210 may generate an internal command ICMD, an internal strobe signal IST, and the precharge signal PCG, based on first to M-th command addresses CA<1:M> in synchronization with the clock CLK. The command decoder 210 may generate the internal command ICMD that is enabled when bits that are used as a command, among the first to M-th command addresses CA<1:M>, have a logic level combination for performing a write operation in synchronization with the clock CLK. The command decoder 210 may generate the internal strobe signal IST that is enabled after a time at which the internal command ICMD is enabled. The command decoder 210 may generate the precharge signal PCG that is enabled after a time at which the internal strobe signal IST is enabled. The command decoder 210 has been implemented to generate the internal command ICMD for performing a write operation, but may be implemented to generate various internal commands for performing various operations according to an embodiment. The power-up operation may be set as an operation of the power supply voltage VDD that is supplied to the semiconductor device 20 rising from 0 V to the level of a target voltage.

The address decoder 220 may generate first to N-th internal addresses IADD<1:N> based on the first to M-th command addresses CA<1:M> in synchronization with the clock CLK. The address decoder 220 may generate the first to N-th internal addresses IADD<1:N> by decoding bits that are used as an address, among the first to M-th command addresses CA<1:M>, in synchronization with the clock CLK.

The reception circuit 230 may generate the first transfer data TD1, the second transfer data TD2, and the third transfer data TD3 by receiving the first data DATA1, the second data DATA2, and the third data DATA3 after the start of a write operation. The reception circuit 230 may generate the first transfer data TD1, the second transfer data TD2, and the third transfer data TD3 by inverting and buffering the first data DATA1, the second data DATA2, and the third data DATA3 after the start of a write operation. The reception circuit 230 may generate the first transfer data TD1, the second transfer data TD2, and the third transfer data TD3 each having a logic high level by driving a node that is included in the reception circuit 230 by first driving power, when the first data DATA1, the second data DATA2, and the third data DATA3 have a logic low level after the start of a write operation. The reception circuit 230 may generate the first transfer data TD1, the second transfer data TD2, and the third transfer data TD3 each having a logic low level by driving a node that is included in the reception circuit 230 by second driving power, when the first data DATA1, the second data DATA2, and the third data DATA3 have a logic high level after the start of a write operation. The first driving power may be set as driving power that drives the first transfer data TD1, the second transfer data TD2, and the third transfer data TD3 to a logic high level. The second driving power may be set as driving power that drives the first transfer data TD1, the second transfer data TD2, and the third transfer data TD3 to a logic low level. The second driving power may be set as driving power smaller than the first driving power.

The data input and output circuit 240 may drive the first input and output line (GIO1 in FIG. 13), the second input and output line (GIO2 in FIG. 13), and the third input and output line (GIO3 in FIG. 13) to the first logic level (i.e., a logic high level) after the end of a power-up operation. The data input and output circuit 240 may drive the first input and output line (GIO1 in FIG. 13), the second input and output line (GIO2 in FIG. 13), and the third input and output line (GIO3 in FIG. 13) to the first logic level (i.e., a logic high level) when the precharge signal PCG is enabled. The data input and output circuit 240 may receive the first transfer data TD1, the second transfer data TD2, and the third transfer data TD3 after the start of a write operation. The data input and output circuit 240 may generate the first internal data ID1, the second internal data ID2, and the third internal data ID3 by driving the first input and output line (GIO1 in FIG. 13), the second input and output line (GIO2 in FIG. 13), and the third input and output line (GIO3 in FIG. 13) based on logic levels of the first transfer data TD1, the second transfer data TD2, and the third transfer data TD3 in synchronization with the internal strobe signal IST. The data input and output circuit 240 may generate the first internal data ID1, the second internal data ID2, and the third internal data ID3 by driving the first input and output line (GIO1 in FIG. 13), the second input and output line (GIO2 in FIG. 13), and the third input and output line (GIO3 in FIG. 13) from each of which transfer data having the second logic level (i.e., a logic low level), among the first transfer data TD1, the second transfer data TD2, and the third transfer data TD3, are output in synchronization with the internal strobe signal IST.

The memory circuit 250 may include multiple memory cells MC. The memory circuit 250 may store the first internal data ID1, the second internal data ID2, and the third internal data ID3 in the multiple memory cells MC, based on the internal command ICMD and the first to N-th internal addresses IADD<1:N>. The memory circuit 250 may store the first internal data ID1, the second internal data ID2, and the third internal data ID3 in a memory cell MC that is selected by the first to N-th internal addresses IADD<1:N>, among the multiple memory cells MC, when the internal command ICMD is enabled. The memory circuit 250 has been implemented to perform a write operation, but may be implemented to perform various operations according to an embodiment.

The semiconductor device 20 may drive the first input and output line (GIO1 in FIG. 13), the second input and output line (GIO2 in FIG. 13), and the third input and output line (GIO3 in FIG. 13) to the first logic level (i.e., a logic high level) after the end of a power-up operation. The semiconductor device 20 may perform a write operation based on the first to M-th command addresses CA<1:M> in synchronization with the clock CLK. The semiconductor device 20 may generate the first transfer data TD1, the second transfer data TD2, and the third transfer data TD3 by receiving the first data DATA1, the second data DATA2, and the third data DATA3 after the start of a write operation. The semiconductor device 20 may generate the first internal data ID1, the second internal data ID2, and the third internal data ID3 by driving the first input and output line (GIO1 in FIG. 13), the second input and output line (GIO2 in FIG. 13), and the third input and output line (GIO3 in FIG. 13) from each of which transfer data having the second logic level (i.e., a logic low level), among the first transfer data TD1, the second transfer data TD2, and the third transfer data TD3, are output after the start of a write operation. The semiconductor device 20 may store the first internal data ID1, the second internal data ID2, and the third internal data ID3 after the start of a write operation.

Figure 9:
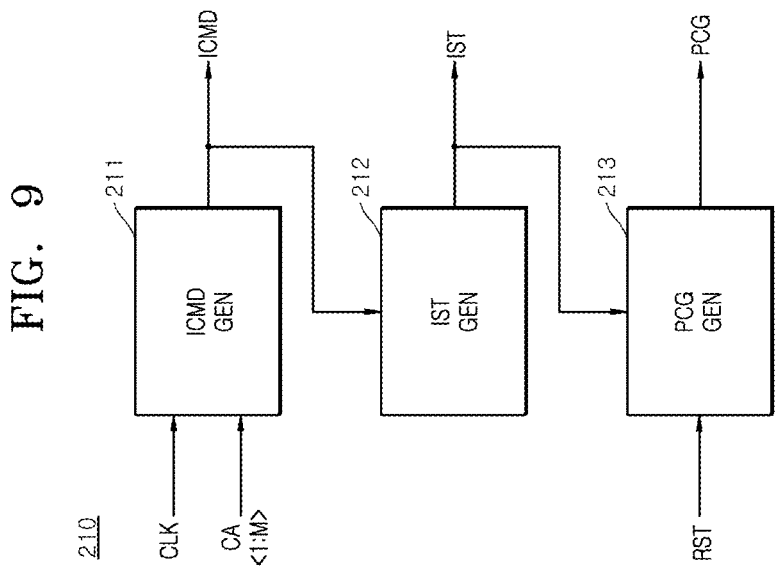
FIG. 9 is a block diagram illustrating a construction according to an embodiment of a command decoder that is included in the semiconductor device illustrated in FIG. 8.

Referring to FIG. 9, the command decoder 210 according to an embodiment of the present disclosure may include an internal command generation circuit (ICMD GEN) 211, an internal strobe signal generation circuit (IST GEN) 212, and a precharge signal generation circuit (PCG GEN) 213.

The internal command generation circuit 211 may generate the internal command ICMD based on the first to M-th command addresses CA<1:M> in synchronization with the clock CLK. The internal command generation circuit 211 may generate the internal command ICMD that is enabled when bits that are used as a command, among the first to M-th command addresses CA<1:M>, have a logic level combination for performing a write operation in synchronization with the clock CLK.

The internal strobe signal generation circuit 212 may generate the internal strobe signal IST based on the internal command ICMD. The internal strobe signal generation circuit 212 may generate the internal strobe signal IST that is enabled after a time at which the internal command ICMD is enabled.

The precharge signal generation circuit 213 may generate the precharge signal PCG that is enabled after the end of a power-up operation. The precharge signal generation circuit 213 may generate the precharge signal PCG that is enabled when a reset signal RST is enabled, after the end of the power-up operation. The precharge signal generation circuit 213 may generate the precharge signal PCG that is enabled when the internal strobe signal IST is disabled, after the start of a write operation.

Figure 10:
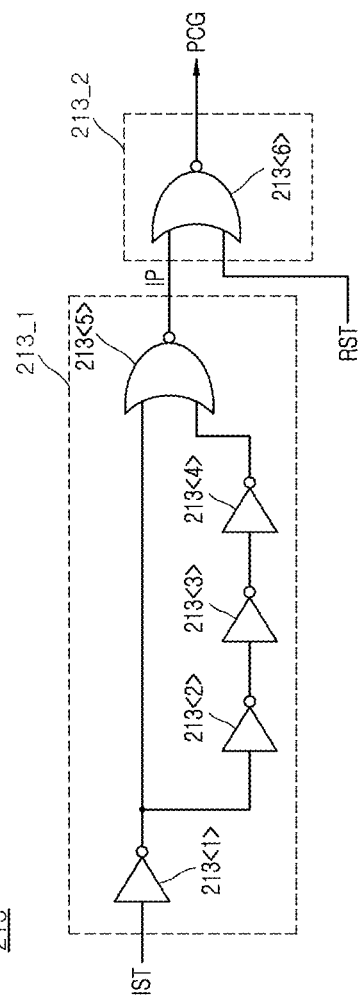
FIG. 10 is a circuit diagram illustrating a construction according to an embodiment of a precharge signal generation circuit that is included in the command decoder illustrated in FIG. 9.

Referring to FIG. 10, the precharge signal generation circuit 213 according to an embodiment of the present disclosure may include a pulse generation circuit 213_1 and a logic circuit 213_2.

The pulse generation circuit 213_1 may be implemented by using inverters 213<1>, 213<2>, 213<3>, and 213<4>, and a NOR gate 213<5>. The pulse generation circuit 213_1 may generate an internal pulse IP that is enabled when the internal strobe signal IST is disabled to a logic high level. The pulse generation circuit 213_1 may generate the internal pulse IP including a pulse having a logic high level, when the internal strobe signal IST is disabled to a logic high level.

The logic circuit 213_2 may be implemented by using a NOR gate 213<6>. The logic circuit 213_2 may generate the precharge signal PCG, based on the internal pulse IP and the reset signal RST. The logic circuit 213_2 may generate the precharge signal PCG by performing a NOR operation on the internal pulse IP and the reset signal RST. The logic circuit 213_2 may generate the precharge signal PCG that is enabled to a logic low level when any one of the internal pulse IP and the reset signal RST is enabled to a logic high level. The logic circuit 213_2 may generate the precharge signal PCG that is disabled to a logic high level when both the internal pulse IP and the reset signal RST are disabled to a logic low level.

Figure 11:
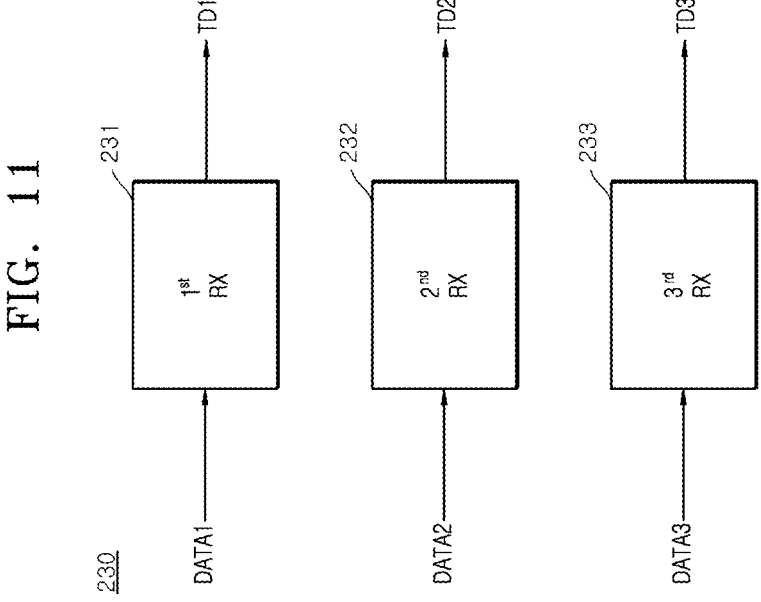
FIG. 11 is a block diagram illustrating a construction according to an embodiment of a reception circuit that is included in the semiconductor device illustrated in FIG. 8.

Referring to FIG. 11, the reception circuit 230 according to an embodiment of the present disclosure may include a first receiver (1$^{st}$ RX) 231, a second receiver (2$^{nd}$ RX) 232, and a third receiver (3$^{rd}$ RX) 233.

The first receiver 231 may generate the first transfer data TD1 by receiving the first data DATA1 after the start of a write operation. The first receiver 231 may generate the first transfer data TD1 by inverting and buffering the first data DATA1. The first receiver 231 may drive the first transfer data TD1 by first driving power when the first data DATA1 has a logic low level. The first receiver 231 may drive the first transfer data TD1 by second driving power when the first data DATA1 has a logic high level.

The second receiver 232 may generate the second transfer data TD2 by receiving the second data DATA2 after the start of a write operation. The second receiver 232 may generate the second transfer data TD2 by inverting and buffering the second data DATA2. The second receiver 232 may drive the second transfer data TD2 by first driving power when the second data DATA2 has a logic low level. The second receiver 232 may drive the second transfer data TD2 by second driving power when the second data DATA2 has a logic high level.

The third receiver 233 may generate the third transfer data TD3 by receiving the third data DATA3 after the start of a write operation. The third receiver 233 may generate the third transfer data TD3 by inverting and buffering the third data DATA3. The third receiver 233 may drive the third transfer data TD3 by first driving power when the third data DATA3 has a logic low level. The third receiver 233 may drive the third transfer data TD3 by second driving power when the third data DATA3 has a logic high level.

Figure 12:
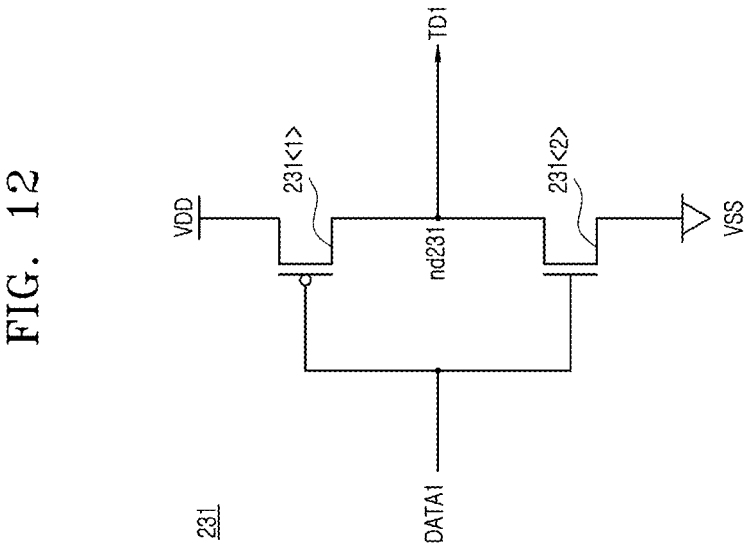
FIG. 12 is a circuit diagram illustrating a construction according to an embodiment of a first receiver that is included in the reception circuit illustrated in FIG. 11.

Referring to FIG. 12, the first receiver 231 according to an embodiment of the present disclosure may be implemented by using a pull-up driving element 231<1> and a pull-down driving element 231<2>.

The pull-up driving element 231<1> may be implemented by using a PMOS transistor. The pull-up driving element 231<1> may be disposed between the power supply voltage VDD and a node nd231. The pull-up driving element 231<1> may generate the first transfer data TD1 having a logic high level by driving the node nd231 to the level of the power supply voltage VDD when the first data DATA1 has a logic low level. Driving power by which the pull-up driving element 231<1> drives the node nd231 to the level of the power supply voltage VDD may be set as first driving power. The first driving power may mean driving power that is determined based on the length and width of the pull-up driving element 231<1> and that drives the node nd231 to the level of the power supply voltage VDD.

The pull-down driving element 231<2> may be implemented by using an NMOS transistor. The pull-down driving element 231<2> may be disposed between the node nd231 and the ground voltage VSS. The pull-down driving element 231<2> may generate the first transfer data TD1 having a logic low level by driving the node nd231 to the level of the ground voltage VSS when the first data DATA1 has a logic high level. Driving power by which the pull-down driving element 231<2> drives the node nd231 to the level of the ground voltage VSS may be set as second driving power. The second driving power may mean driving power that is determined based on the length and width of the pull-down driving element 231<2> and that drives the node nd231 to the level of the ground voltage VSS. The pull-down driving element 231<2> may be implemented to have a longer length than the pull-up driving element 231<1> and to have a smaller width than the pull-up driving element 231<1>. Accordingly, the second driving power may be set as driving power smaller than the first driving power.

In this case, the time for which the first receiver 231 drives the first transfer data TD1 to a logic low level by the second driving power may be set as the time longer than the time for which the first receiver 231 drives the first transfer data TD1 to a logic high level by the first driving power. The reason why the time for which the first receiver 231 drives the first transfer data TD1 to a logic low level is set to be longer is for securing a data window of the first internal data ID1.

Each of the second receiver 232 and the third receiver 233 illustrated in FIG. 11 may be implemented to have the same circuit as the first receiver 231 illustrated in FIG. 12 and may perform the same operation as the first receiver 231 illustrated in FIG. 12 except input and output signals for each of the second receiver 232 and the third receiver 233, and thus a detailed description thereof is omitted.

Figure 13:
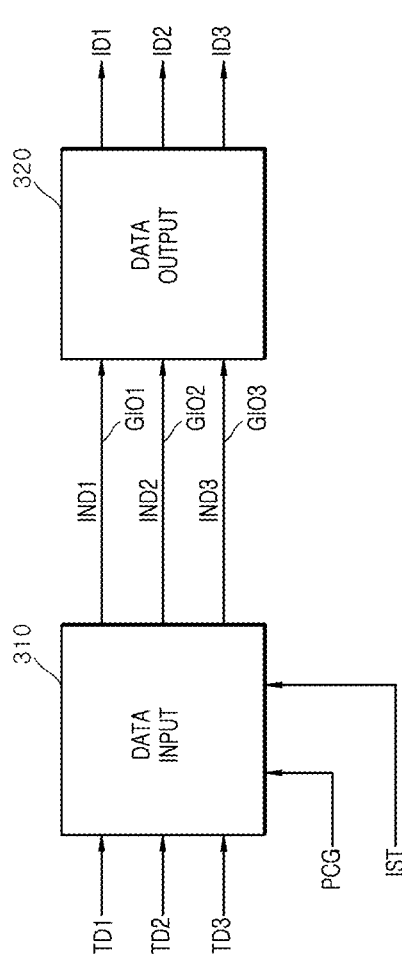
FIG. 13 is a block diagram illustrating a construction according to an embodiment of a data input and output circuit that is included in the semiconductor device illustrated in FIG. 8.

Referring to FIG. 13, the data input and output circuit 240 according to an embodiment of the present disclosure may include a data input circuit (DATA INPUT) 310 and a data output circuit (DATA OUTPUT) 320.

The data input circuit 310 may precharge the first input and output line GIO1, the second input and output line GIO2, and the third input and output line GIO3 after the end of a power-up operation. The data input circuit 310 may precharge the first input and output line GIO1, the second input and output line GIO2, and the third input and output line GIO3 to the first logic level (i.e., a logic high level) when the precharge signal PCG is enabled after the end of the power-up operation. The data input circuit 310 may receive the first transfer data TD1, the second transfer data TD2, and the third transfer data TD3 after the start of a write operation. The data input circuit 310 may generate first input data IND1, second input data IND2, and third input data IND3 by driving the first input and output line GIO1, the second input and output line GIO2, and the third input and output line GIO3 based on logic levels of the first transfer data TD1, the second transfer data TD2, and the third transfer data TD3 in synchronization with the internal strobe signal IST.

The data output circuit 320 may generate the first internal data ID1, the second internal data ID2, and the third internal data ID3 by receiving the first input data IND1, the second input data IND2, and the third input data IND3. The data output circuit 320 may generate the first internal data ID1, the second internal data ID2, and the third internal data ID3 based on logic levels of the first input data IND1, the second input data IND2, and the third input data IND3. The data output circuit 320 may generate the first internal data ID1, the second internal data ID2, and the third internal data ID3 by inverting and buffering the first input data IND1, the second input data IND2, and the third input data IND3. The data output circuit 320 may generate the first internal data ID1, the second internal data ID2, and the third internal data ID3 having a logic high level by driving a node that is included in the data output circuit 320 by first driving power when the first input data IND1, the second input data IND2, and the third input data IND3 have a logic low level. The data output circuit 320 may generate the first internal data ID1, the second internal data ID2, and the third internal data ID3 having a logic low level by driving a node that is included in the data output circuit 320 by second driving power when the first input data IND1, the second input data IND2, and the third input data IND3 have a logic high level. The first driving power may be set as driving power that drives the first internal data ID1, the second internal data ID2, and the third internal data ID3 to a logic high level. The second driving power may be set as driving power that drives the first internal data ID1, the second internal data ID2, and the third internal data ID3 to a logic low level. The second driving power may be set as driving power smaller than the first driving power.

Figure 14:
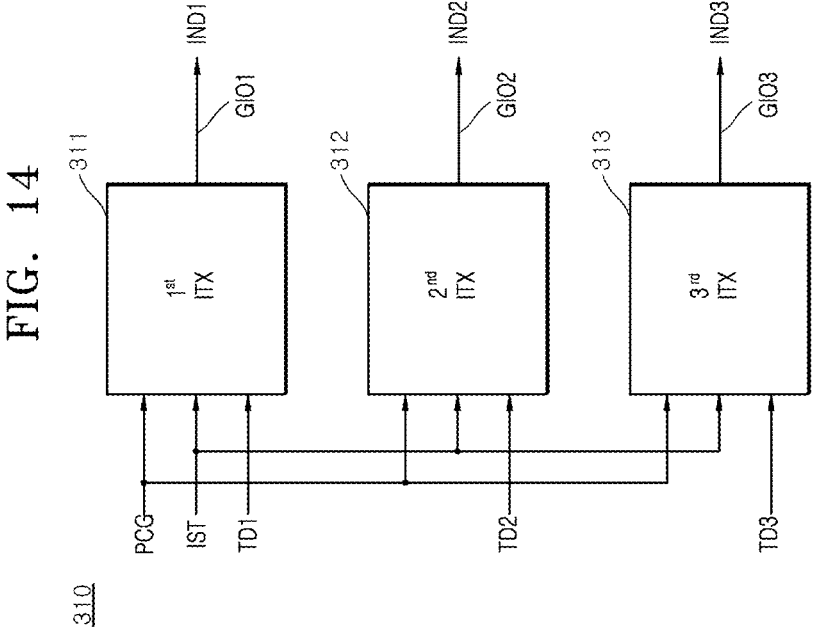
FIG. 14 is a block diagram illustrating a construction according to an embodiment of a data input circuit that is included in the data input and output circuit illustrated in FIG. 13.

As illustrated in FIG. 14, the data input circuit 310 according to an embodiment of the present disclosure may include a first internal transmitter ($1^{st}$ ITX) 311, a second internal transmitter ($2^{nd}$ ITX) 312, and a third internal transmitter ($3^{rd}$ ITX) 313.

The first internal transmitter 311 may drive the first input and output line GIO1 to the first logic level (i.e., a logic high level) after the end of a power-up operation. The first internal transmitter 311 may drive the first input and output line GIO1 to the first logic level (i.e., a logic high level) when the precharge signal PCG is enabled. The first internal transmitter 311 may drive the first input and output line GIO1 to the second logic level (i.e., a logic low level) when the first transfer data TD1 having the second logic level (i.e., a logic low level) is input after the start of a write operation. The first internal transmitter 311 may drive, to the second logic level (i.e., a logic low level), the first input and output line GIO1 that has been driven to the first logic level (i.e., a logic high level), when the first transfer data TD1 having the second logic level (i.e., a logic low level) is input in synchronization with the internal strobe pulse IST after the start of a write operation. The first internal transmitter 311 may output the first input data IND1 having the second logic level (i.e., a logic low level) by driving the first input and output line GIO1 to the second logic level (i.e., a logic low level). The first internal transmitter 311 may be implemented to drive the first input and output line GIO1 to the second logic level (i.e., a logic low level) after the end of a power-up operation according to an embodiment. The first internal transmitter 311 may drive, to the first logic level (i.e., a logic high level), the first input and output line GIO1 that has been driven to the second logic level (i.e., a logic low level), when the first transfer data TD1 having the first logic level (i.e., a logic high level) is input after the start of a write operation according to an embodiment. The first internal transmitter 311 may output the first input data IND1 having the first logic level (i.e., a logic high level) by driving the first input and output line GIO1 to the first logic level (i.e., a logic high level) according to an embodiment.

The second internal transmitter 312 may drive the second input and output line GIO2 to the first logic level (i.e., a logic high level) after the end of a power-up operation. The second internal transmitter 312 may drive the second input and output line GIO2 to the first logic level (i.e., a logic high level) when the precharge signal PCG is enabled. The second internal transmitter 312 may drive the second input and output line GIO2 to the second logic level (i.e., a logic low level) when the second transfer data TD2 having the second logic level (i.e., a logic low level) is input after the start of a write operation. The second internal transmitter 312 may drive, to the second logic level (i.e., a logic low level), the second input and output line GIO2 that has been driven to the first logic level (i.e., a logic high level), when the second transfer data TD2 having the second logic level (i.e., a logic low level) is input in synchronization with the internal strobe pulse IST after the start of a write operation. The second internal transmitter 312 may output the second input data IND2 having the second logic level (i.e., a logic low level) by driving the second input and output line GIO2 to the second logic level (i.e., a logic low level). The second internal transmitter 312 may be implemented to drive the second input and output line GIO2 to the second logic level (i.e., a logic low level) after the end of a power-up operation according to an embodiment. The second internal transmitter 312 may drive, to the first logic level (i.e., a logic high level), the second input and output line GIO2 that has been driven to the second logic level (i.e., a logic low level), when the second transfer data TD2 having the first logic level (i.e., a logic high level) is input after the start of a write operation according to an embodiment. The second internal transmitter 312 may output the second input data IND2 having the first logic level (i.e., a logic high level) by driving the second input and output line GIO2 to the first logic level (i.e., a logic high level) according to an embodiment.

The third internal transmitter 313 may drive the third input and output line GIO3 to the first logic level (i.e., a logic high level) after the end of a power-up operation. The third internal transmitter 313 may drive the third input and output line GIO3 to the first logic level (i.e., a logic high level) when the precharge signal PCG is enabled. The third internal transmitter 313 may drive the third input and output line GIO3 to the second logic level (i.e., a logic low level) when the third transfer data TD3 having the second logic level (i.e., a logic low level) is input after the start of a write operation. The third internal transmitter 313 may drive, to the second logic level (i.e., a logic low level), the third input and output line GIO3 that has been driven to the first logic level (i.e., a logic high level) when the third transfer data TD3 having the second logic level (i.e., a logic low level) is input in synchronization with the internal strobe pulse IST after the start of a write operation. The third internal transmitter 313 may output the third input data IND3 having the second logic level (i.e., a logic low level) by driving the third input and output line GIO3 to the second logic level (i.e., a logic low level). The third internal transmitter 313 may be implemented to drive the third input and output line GIO3 to the second logic level (i.e., a logic low level) after the end of a power-up operation according to an embodiment. The third internal transmitter 313 may drive, to the first logic level (i.e., a logic high level), the third input and output line GIO3 that has been driven to the second logic level (i.e., a logic low level), when the third transfer data TD3 having the first logic level (i.e., a logic high level) is input after the start of a write operation according to an embodiment. The third internal transmitter 313 may output the third input data IND3 having the first logic level (i.e., a logic high level) by driving the third input and output line GIO3 to the first logic level (i.e., a logic high level) according to an embodiment.

Figure 15:
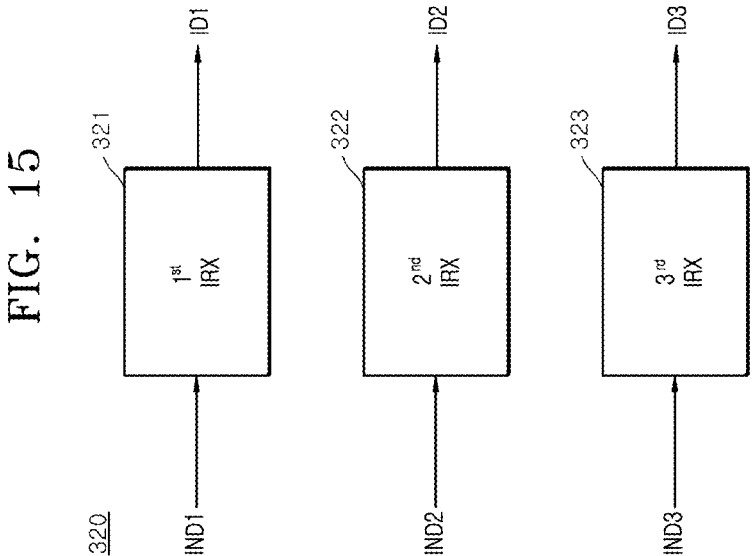
FIG. 15 is a block diagram illustrating a construction according to an embodiment of a data output circuit that is included in the data input and output circuit illustrated in FIG. 13.

Referring to FIG. 15, the data output circuit 320 according to an embodiment of the present disclosure may include a first internal receiver ($1^{st}$ IRX) 321, a second internal receiver ($2^{nd}$ IRX) 322, and a third internal receiver ($3^{rd}$ IRX) 323.

The first internal receiver 321 may generate the first internal data ID1 by receiving the first input data IND1 after the start of a write operation. The first internal receiver 321 may generate the first internal data ID1 by inverting and buffering the first input data IND1. The first internal receiver 321 may drive the first internal data ID1 by the first driving power when the first input data IND1 has a logic low level. The first internal receiver 321 may drive the first internal data ID1 by the second driving power when the first input data IND1 has a logic high level.

The second internal receiver 322 may generate the second internal data ID2 by receiving the second input data IND2 after the start of a write operation. The second internal receiver 322 may generate the second internal data ID2 by inverting and buffering the second input data IND2. The second internal receiver 322 may drive the second internal data ID2 by the first driving power when the second input data IND2 has a logic low level. The second internal receiver 322 may drive the second internal data ID2 by the second driving power when the second input data IND2 has a logic high level.

The third internal receiver 323 may generate the third internal data ID3 by receiving the third input data IND3 after the start of a write operation. The third internal receiver 323 may generate the third internal data ID3 by inverting and buffering the third input data IND3. The third internal receiver 323 may drive the third internal data ID3 by the first driving power when the third input data IND3 has a logic low level. The third internal receiver 323 may drive the third internal data ID3 by the second driving power when the third input data IND3 has a logic high level.

Figure 16:
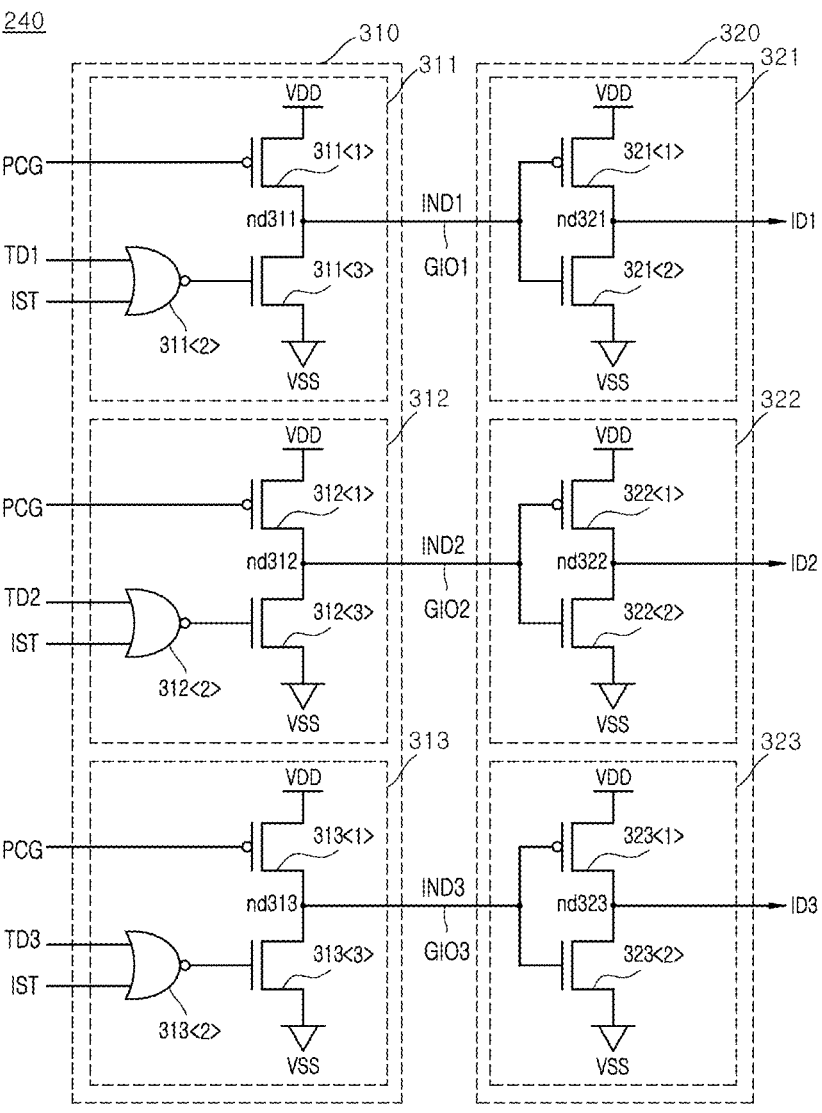
FIG. 16 is a circuit diagram illustrating a construction of the data input and output circuit illustrated in FIG. 13.

FIG. 16 is a circuit diagram illustrating a construction of the data input and output circuit 240 illustrated in FIGS. 13 to 15.

The first internal transmitter 311 may be implemented by using a pull-up driving element 311<1>, a NOR gate 311<2>, and a pull-down driving element 311<3>.

The pull-up driving element 311<1> may be implemented by using a PMOS transistor. The pull-up driving element 311<1> may be disposed between the power supply voltage VDD and a node nd311. The pull-up driving element 311<1> may drive the first input and output line GIO1 to a logic high level by driving the node nd311 to the level of the power supply voltage VDD when the precharge signal PCG is enabled to a logic low level.

The NOR gate 311<2> may output the internal strobe pulse IST and the first transfer data TD1 by performing a NOR operation on the internal strobe pulse IST and the first transfer data TD1. The NOR gate 311<2> may generate an output signal having a logic high level, when the internal strobe pulse IST is enabled to a logic low level and the first transfer data TD1 has a logic low level.

The pull-down driving element 311<3> may be implemented by using an NMOS transistor. The pull-down driving element 311<3> may be disposed between the node nd311 and the ground voltage VSS. The pull-down driving element 311<3> may drive the first input and output line GIO1 to a logic low level by driving the node nd311 to the level of the ground voltage VSS when the output signal of the NOR gate 311<2> is enabled to a logic high level.

The second internal transmitter 312 may be implemented by using a pull-up driving element 312<1>, a NOR gate 312<2>, and a pull-down driving element 312<3>.

The pull-up driving element 312<1> may be implemented by using a PMOS transistor. The pull-up driving element 312<1> may be disposed between the power supply voltage VDD and a node nd312. The pull-up driving element 312<1> may drive the second input and output line GIO2 to a logic high level by driving the node nd312 to the level of the power supply voltage VDD when the precharge signal PCG is enabled to a logic low level.

The NOR gate 312<2> may output the internal strobe pulse IST and the second transfer data TD2 by performing a NOR operation on the internal strobe pulse IST and the second transfer data TD2. The NOR gate 312<2> may generate an output signal having a logic high level, when the internal strobe pulse IST is enabled to a logic low level and the second transfer data TD2 has a logic low level.

The pull-down driving element 312<3> may be implemented by using an NMOS transistor. The pull-down driving element 312<3> may be disposed between the node nd312 and the ground voltage VSS. The pull-down driving element 312<3> may drive the second input and output line GIO2 to a logic low level by driving the node nd312 to the level of the ground voltage VSS when the output signal of the NOR gate 312<2> is enabled to a logic high level.

The third internal transmitter 313 may be implemented by using a pull-up driving element 313<1>, a NOR gate 313<2>, and a pull-down driving element 313<3>.

The pull-up driving element 313<1> may be implemented by using a PMOS transistor. The pull-up driving element 313<1> may be disposed between the power supply voltage VDD and a node nd313. The pull-up driving element 313<1> may drive the third input and output line GIO3 to a logic high level by driving the node nd313 to the level of the power supply voltage VDD when the precharge signal PCG is enabled to a logic low level.

The NOR gate 313<2> may output the internal strobe pulse IST and the third transfer data TD3 by performing a NOR operation on the internal strobe pulse IST and the third transfer data TD3. The NOR gate 313<2> may generate an output signal having a logic high level, when the internal strobe pulse IST is enabled to a logic low level and the third transfer data TD3 has a logic low level.

The pull-down driving element 313<3> may be implemented by using an NMOS transistor. The pull-down driving element 313<3> may be disposed between the node nd313 and the ground voltage VSS. The pull-down driving element 313<3> may drive the second input and output line GIO2 to a logic low level by driving the node nd313 to the level of the ground voltage VSS when the output signal of the NOR gate 313<2> is enabled to a logic high level.

The first internal receiver 321 may be implemented by using a pull-up driving element 321<1> and a pull-down driving element 321<2>.

The pull-up driving element 321<1> may be implemented by using a PMOS transistor. The pull-up driving element 321<1> may be disposed between the power supply voltage VDD and a node nd321. The pull-up driving element 321<1> may generate the first internal data ID1 having a logic high level by driving the node nd321 to the level of the power supply voltage VDD when the first input data IND1 has a logic low level. Driving power by which the pull-up driving element 321<1> drives the node nd321 to the level of the power supply voltage VDD may be set as first driving power. The first driving power may mean driving power that is determined based on the length and width of the pull-up driving element 321<1> and that drives the node nd321 to the level of the power supply voltage VDD.

The pull-down driving element 321<2> may be implemented by using an NMOS transistor. The pull-down driving element 321<2> may be disposed between the node nd321 and the ground voltage VSS. The pull-down driving element 321<2> may generate the first internal data ID1 having a logic low level by driving the node nd321 to the level of the ground voltage VSS when the first input data IND1 has a logic high level. Driving power by which the pull-down driving element 321<2> drives the node nd321 to the level of the ground voltage VSS may be set as second driving power. The second driving power may mean driving power that is determined based on the length and width of the pull-down driving element 321<2> and that drives the node nd231 to the level of the ground voltage VSS. The pull-down driving element 321<2> may be implemented to have a longer length than the pull-up driving element 321<1> and to have a smaller width than the pull-up driving element 321<1>. Accordingly, the second driving power may be set as driving power smaller than the first driving power.

The second internal receiver 322 may be implemented by using a pull-up driving element 322<1> and a pull-down driving element 322<2>.

The pull-up driving element 322<1> may be implemented by using a PMOS transistor. The pull-up driving element 322<1> may be disposed between the power supply voltage VDD and a node nd322.

The pull-up driving element 322<1> may generate the second internal data ID2 having a logic high level by driving the node nd322 to the level of the power supply voltage VDD when the second input data IND2 has a logic low level. Driving power by which the pull-up driving element 322<1> drives the node nd322 to the level of the power supply voltage VDD may be set as first driving power. The first driving power may mean driving power that is determined based on the length and width of the pull-up driving element 322<1> and that drives the node nd322 to the level of the power supply voltage VDD.

The pull-down driving element 322<2> may be implemented by using an NMOS transistor. The pull-down driving element 322<2> may be disposed between the node nd322 and the ground voltage VSS. The pull-down driving element 322<2> may generate the second internal data ID2 having a logic low level by driving the node nd322 to the level of the ground voltage VSS when the second input data IND2 has a logic high level. Driving power by which the pull-down driving element 322<2> drives the node nd322 to the level of the ground voltage VSS may be set as second driving power. The second driving power may mean driving power that is determined based on the length and width of the pull-down driving element 322<2> and that drives the node nd322 to the level of the ground voltage VSS. The pull-down driving element 322<2> may be implemented to have a longer length than the pull-up driving element 322<1> and to have a smaller width than the pull-up driving element 322<1>. Accordingly, the second driving power may be set as driving power smaller than the first driving power.

The third internal receiver 323 may be implemented by using a pull-up driving element 323<1> and a pull-down driving element 323<2>.

The pull-up driving element 323<1> may be implemented by using a PMOS transistor. The pull-up driving element 323<1> may be disposed between the power supply voltage VDD and a node nd323. The pull-up driving element 323<1> may generate the third internal data ID3 having a logic high level by driving the node nd323 to the level of the power supply voltage VDD when the third input data IND3 has a logic low level. Driving power by which the pull-up driving element 323<1> drives the node nd323 to the level of the power supply voltage VDD may be set as first driving power. The first driving power may mean driving power that is determined based on the length and width of the pull-up driving element 323<1> and that drives the node nd323 to the level of the power supply voltage VDD.

The pull-down driving element 323<2> may be implemented by using an NMOS transistor. The pull-down driving element 323<2> may be disposed between the node nd323 and the ground voltage VSS. The pull-down driving element 323<2> may generate the third internal data ID3 having a logic low level by driving the node nd323 to the level of the ground voltage VSS when the third input data IND3 has a logic high level. Driving power by which the pull-down driving element 323<2> drives the node nd323 to the level of the ground voltage VSS may be set as second driving power. The second driving power may mean driving power that is determined based on the length and width of the pull-down driving element 323<2> and that drives the node nd323 to the level of the ground voltage VSS. The pull-down driving element 323<2> may be implemented to have a longer length than the pull-up driving element 323<1> and to have a smaller width than the pull-up driving element 323<1>. Accordingly, the second driving power may be set as driving power smaller than the first driving power.

Figure 17:
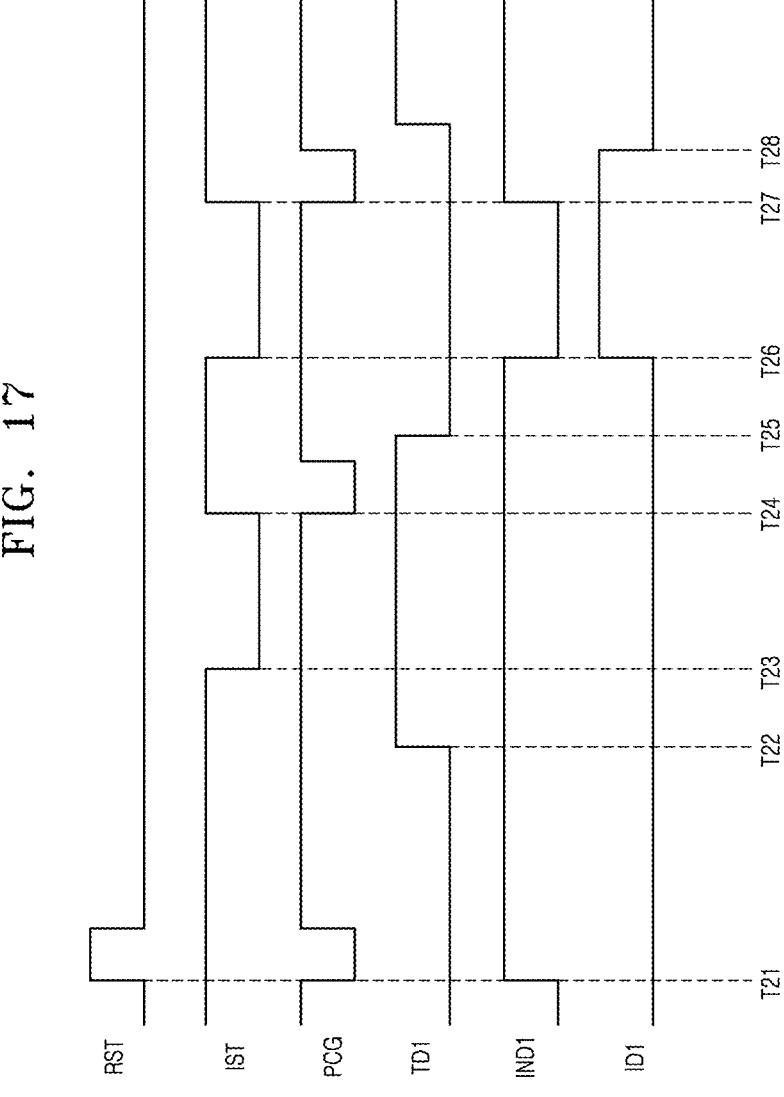
FIG. 17 is a timing diagram for describing an operation of a first internal transmitter and first internal receiver illustrated in FIG. 16.

FIG. 17 is a timing diagram for describing an operation of the semiconductor device 20 according to an embodiment of the present disclosure. A power-up operation and a write operation are described with reference to FIG. 17, but an operation of generating the first internal data ID1 by receiving the first transfer data TD1 having a logic low level after the first transfer data TD1 having a logic high level is input after the start of a write operation is described as an example as follows.

At time T21, the reset signal RST may be input as a pulse having a logic high level after the end of a power-up operation.

The command decoder 210 may generate the precharge signal PCG that is enabled to a logic low level as the reset signal RST having a logic high level is input after the end of the power-up operation.

The first internal transmitter 311 may output the first input data IND1 having a logic high level by driving the first input and output line GIO1 to a logic high level when the precharge signal PCG is enabled to a logic low level.

At time T22, the first transfer data TD1 having a logic high level may be input.

At time T23, the command decoder 210 may generate the internal strobe signal IST that is enabled to a logic low level after the start of a write operation.

The first internal transmitter 311 may output the first input data IND1 having a logic high level because the first input and output line GIO1 is not driven to a logic low level, when the internal strobe pulse IST is enabled to a logic low level and the first transfer data TD1 has a logic high level.

The first internal receiver 321 may generate the first internal data ID1 having a logic low level by inverting and buffering the first input data IND1.

The memory circuit 250 may store the first internal data ID1 in a memory cell MC that is selected by the first to N-th internal addresses IADD<1:N>, among the multiple memory cells MC, after the start of a write operation.

At time T24, the command decoder 210 may generate the precharge signal PCG that is enabled to a logic low level when the internal strobe signal IST is disabled to a logic high level.

The first internal transmitter 311 may output the first input data IND1 having a logic high level by driving the first input and output line GIO1 to a logic high level when the precharge signal PCG is enabled to a logic low level.

At time T25, the first transfer data TD1 having a logic low level may be input.

At time T26, the command decoder 210 may generate the internal strobe signal IST that is enabled to a logic low level after the start of a write operation.

The first internal transmitter 311 may output the first input data IND1 having a logic low level by driving the first input and output line GIO1 to a logic low level, when the internal strobe pulse IST is enabled to a logic low level and the first transfer data TD1 has a logic low level.

The first internal receiver 321 may generate the first internal data ID1 having a logic high level by driving the first internal data ID1 by the first driving power when the first input data IND1 has a logic low level.

The memory circuit 250 may store the first internal data ID1 in a memory cell MC that is selected by the first to N-th internal addresses IADD<1:N>, among the multiple memory cells MC, after the start of a write operation.

At time T27, the command decoder 210 may generate the precharge signal PCG that is enabled to a logic low level when the internal strobe signal IST is disabled to a logic high level.

The first internal transmitter 311 may output the first input data IND1 having a logic high level by driving the first input and output line GIO1 to a logic high level when the precharge signal PCG is enabled to a logic low level.

The first internal receiver 321 may drive the first internal data ID1 by the second driving power when the first input data IND1 has a logic high level. In this case, the first internal receiver 321 may generate the first internal data ID1 having a logic high level because the first internal receiver 321 drives the first internal data ID1 by the second driving power.

At time T28, the first internal receiver 321 may generate the first internal data ID1 having a logic low level by driving the first internal data ID1 by the second driving power. That is, the first internal receiver 321 may drive the first internal data ID1 by the second driving power when the first input data IND1 has a logic high level, so that an interval in which the first internal data ID1 has a logic high level may be increased.

The semiconductor device 20 according to an embodiment of the present disclosure may drive the first to third input and output lines GIO1, GIO2, and GIO3 to the first logic level (i.e., a logic high level) after the end of a power-up operation. The semiconductor device 20 can prevent an error of the level transition of data attributable to an interference phenomenon at a time at which the data are toggled in a way to generate the first to third internal data ID1, ID2, and ID3 and store the first to third internal data ID1, ID2, and ID3 by driving, to the second logic level (i.e., a logic low level), the first to third input and output lines GIO1, GIO2, and GIO3 that have been driven to the first logic level (i.e., a logic high level) when the first to third data DATA1, DATA2, and DATA3 having the second logic level (i.e., a logic low level) are input after the start of a write operation.

Figure 18:
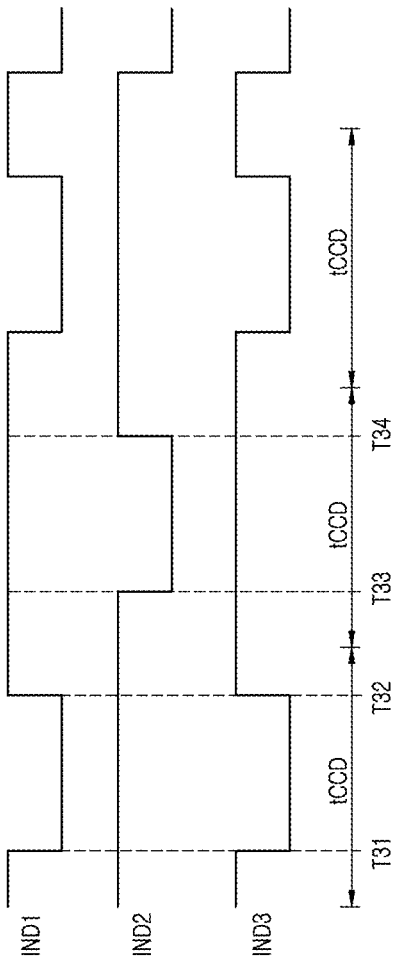
FIG. 18 is a timing diagram for describing an operation of the data output circuit illustrated in FIG. 15.

FIG. 18 is a timing diagram for describing an operation of the data output circuit illustrated in FIG. 15.

A write operation according to an embodiment of the present disclosure is described with reference to FIG. 18, but an operation of the first input data IND1 having a logic low level L, the second input data IND2 having a logic high level H, and the third input data IND3 having a logic low level L being output during the first set interval tCCD and an operation of the first input data IND1 having a logic high level H, the second input data IND2 having a logic low level L, and the third input data IND3 having a logic high level H being output during the second set interval tCCD are described as an example as follows.

Prior to a description, after the end of a power-up operation, the first internal transmitter 311 may output the first input data IND1 having a logic high level by driving the first input and output line GIO1 to a logic high level in response to the precharge signal PCG that is generated when the reset signal RST is enabled. The second internal transmitter 312 may output the second input data IND2 having a logic high level by driving the second input and output line GIO2 to a logic high level in response to the precharge signal PCG that is generated when the reset signal RST is enabled. The third internal transmitter 313 may output the third input data IND3 having a logic high level by driving the third input and output line GIO3 to a logic high level in response to the precharge signal PCG that is generated when the reset signal RST is enabled.

First, the operation of the first input data IND1 having a logic low level L, the second input data IND2 having a logic high level H, and the third input data IND3 having a logic low level L being output during the first set interval tCCD is described as follows.

At time T31, the first internal transmitter 311 may output the first input data IND1 having a logic low level by driving the first input and output line GIO1 to a logic low level when the first transfer data TD1 having a logic low level is input after the start of a write operation. The second internal transmitter 312 might not drive the second input and output line GIO2 to a logic low level when the second transfer data TD2 having a logic high level is input after the start of the write operation. The third internal transmitter 313 may output the third input data IND3 having a logic low level by driving the third input and output line GIO3 to a logic low level when the third transfer data TD3 having a logic low level is input after the start of the write operation.

At time T32, the first internal transmitter 311 may output the first input data IND1 having a logic high level by driving the first input and output line GIO1 to a logic high level in response to the precharge signal PCG that is generated when the internal strobe signal IST is disabled after the start of a write operation. The second internal transmitter 312 may output the second input data IND2 having a logic high level by driving the second input and output line GIO2 to a logic high level in response to the precharge signal PCG that is generated when the internal strobe signal IST is disabled after the start of the write operation. The third transmitter 113 may output the third input data IND3 having a logic high level by driving the third input and output line GIO3 to a logic high level in response to the precharge signal PCG that is generated when the internal strobe signal IST is disabled after the start of the write operation.

Next, the operation of the first input data IND1 having a logic high level H, the second input data IND2 having a logic low level L, and the third input data IND3 having a logic high level H being output during the second set interval tCCD is described as follows.

At time T33, the first internal transmitter 311 might not drive the first input and output line GIO1 to a logic low level when the first transfer data TD1 having a logic high level is input after the start of a write operation. The second internal transmitter 312 may output the second input data IND2 having a logic low level by driving the second input and output line GIO2 to a logic low level when the second transfer data TD2 having a logic low level is input after the start of the write operation. The third internal transmitter 313 might not drive the third input and output line GIO3 to a logic low level when the third transfer data TD3 having a logic low level is input after the start of the write operation.

At time T34, the first internal transmitter 311 may output the first input data IND1 having a logic high level by driving the first input and output line GIO1 to a logic high level in response to the precharge signal PCG that is generated when the internal strobe signal IST is disabled after the start of a write operation. The second internal transmitter 312 may output the second input data IND2 having a logic high level by driving the second input and output line GIO2 to a logic high level in response to the precharge signal PCG that is generated when the internal strobe signal IST is disabled after the start of the write operation. The third internal transmitter 313 may output the third input data IND3 having a logic high level by driving the third input and output line GIO3 to a logic high level in response to the precharge signal PCG that is generated when the internal strobe signal IST is disabled after the start of the write operation.

As described above, the first internal transmitter 311, the second internal transmitter 312, and the third internal transmitter 313 can prevent an error of the level transition of data, which is attributable to an interference phenomenon at a time at which data are toggled, by driving the first input and output line GIO1, the second input and output line GIO2, and the third input and output line GIO3 that are adjacent to each other to the same logic level prior to the time at which the data loaded onto the first input and output line GIO1, the second input and output line GIO2, and the third input and output line GIO3 are toggled.

Figure 19:
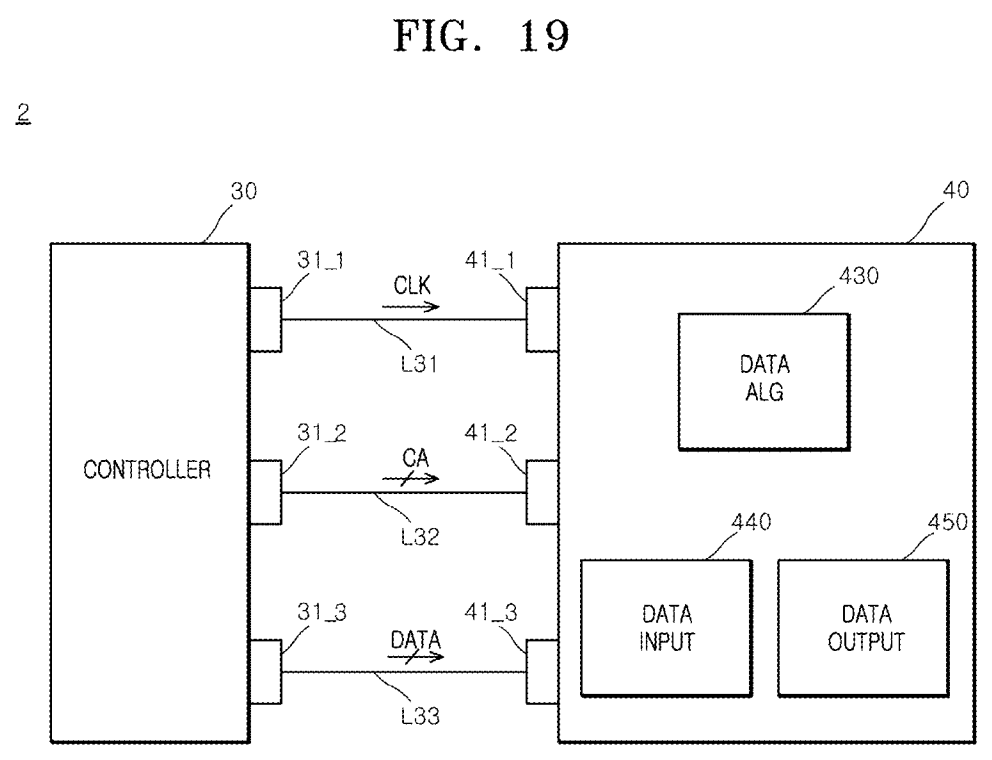

As illustrated in FIG. 19, a semiconductor system 2 according to another embodiment of the present disclosure may include a controller 30 and a semiconductor device 40. The semiconductor device 40 may include a data alignment circuit (DATA ALG) 430, a data input circuit (DATA INPUT) 440, and a data output circuit (DATA OUTPUT) 450.

The controller 30 may include a first control pin 31_1, a second control pin 31_2, and a third control pin 31_3. The semiconductor device 40 may include a first device pin 41_1, a second device pin 41_2, and a third device pin 41_3. A first transmission line L31 may be connected between the first control pin 31_1 and the first device pin 41_1. A second transmission line L32 may be connected between the second control pin 31_2 and the second device pin 41_2. A third transmission line L33 may be connected between the third control pin 31_3 and the third device pin 41_3.

The controller 30 may transmit a clock CLK for controlling the semiconductor device 40 to the semiconductor device 40 through the first transmission line L31. The controller 30 may transmit a command address CA for controlling the semiconductor device 40 to the semiconductor device 40 through the second transmission line L32. The controller 30 may transmit data DATA to the semiconductor device 40 through the third transmission line L33. The clock CLK may be set as a signal that is periodically toggled in order to synchronize operations of the controller 30 and the semiconductor device 40. The command address CA may include multiple bits, and may be set as a signal including a command and an address for controlling an operation of the semiconductor device 40. The data DATA may include multiple bits, and may be set as data that are output in series.

The data alignment circuit 430 may sequentially latch the data DATA that are input in series. The data alignment circuit 430 may generate alignment data (AD1, AD2, and AD3 in FIG. 19) by aligning the latched data DATA.

The data input circuit 440 may precharge a first input and output line (GIO1 in FIG. 20), a second input and output line (GIO2 in FIG. 20), and a third input and output line (GIO3 in FIG. 20) after the end of a power-up operation. The data input circuit 440 may generate first input data (IND1 in FIG. 20), second input data (IND2 in FIG. 20), and third input data (IND3 in FIG. 20 by driving the first input and output line (GIO1 in FIG. 20), the second input and output line (GIO2 in FIG. 20), and the third input and output line (GIO3 in FIG. 20) based on logic levels of the alignment data (AD1, AD2, and AD3 in FIG. 19) after the start of a write operation.

Figure 20:
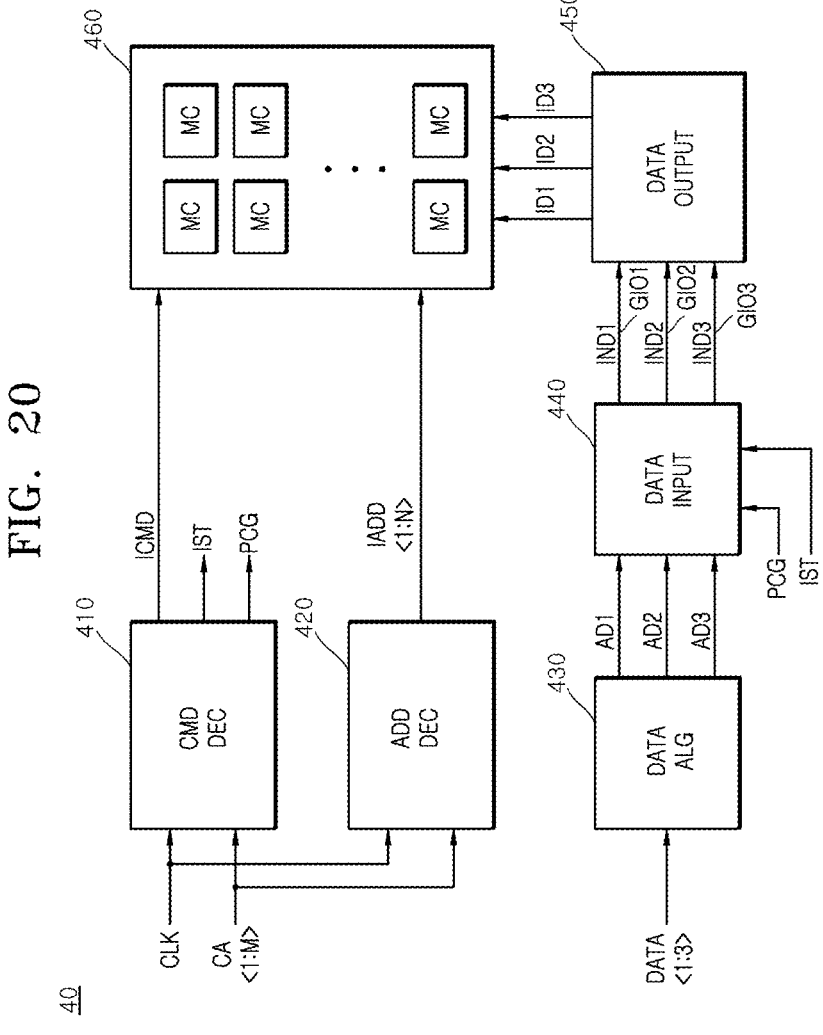
FIG. 20 is a block diagram illustrating a construction according to an embodiment of a semiconductor device that is included in the semiconductor system illustrated in FIG. 19.

The data output circuit 450 may generate first internal data (ID1 in FIG. 20), second internal data (ID2 in FIG. 20), and third internal data (ID3 in FIG. 20) based on logic levels of the first input data (IND1 in FIG. 20), the second input data (IND2 in FIG. 20), and the third input data (IND3 in FIG. 20). The data output circuit 450 may drive the first internal data (ID1 in FIG. 20), the second internal data (ID2 in FIG. 20), and the third internal data (ID3 in FIG. 20) by first driving power or second driving power based on logic levels of the first input data (IND1 in FIG. 20), the second input data (IND2 in FIG. 20), and the third input data (IND3 in FIG. 20).

After the end of a power-up operation, the semiconductor device 40 may drive the first input and output line (GIO1 in FIG. 20), the second input and output line (GIO2 in FIG. 20), and the third input and output line (GIO3 in FIG. 20) to the first logic level (i.e., a logic high level). The semiconductor device 40 may perform a write operation based on the command address CA in synchronization with the clock CLK. The semiconductor device 40 may generate the first alignment data (AD1 in FIG. 20), the second alignment data (AD2 in FIG. 20), and the third alignment data (AD3 in FIG. 20) by latching and aligning the data DATA that are input in series after the start of a write operation. The semiconductor device 40 may generate the first internal data (ID1 in FIG. 20), the second internal data (ID2 in FIG. 20), and the third internal data (ID3 in FIG. 20) by driving the first input and output line (GIO1 in FIG. 20), the second input and output line (GIO2 in FIG. 20), and the third input and output line (GIO3 in FIG. 20) from each of which alignment data having the second logic level (i.e., a logic low level), among the first alignment data (AD1 in FIG. 20), the second alignment data (AD2 in FIG. 20), and the third alignment data (AD3 in FIG. 20), are output after the start of the write operation. The semiconductor device 40 may store the first internal data (ID1 in FIG. 20), the second internal data (ID2 in FIG. 20), and the third internal data (ID3 in FIG. 20) after the start of the write operation.

As illustrated in FIG. 20, the semiconductor device 40 according to another embodiment of the present disclosure may include a command decoder (CMD DEC) 410, an address decoder (ADD DEC) 420, the data alignment circuit (DATA ALG) 430, the data input circuit (DATA INPUT) 440, the data output circuit (DATA OUTPUT) 450, and a memory circuit 460.

The command decoder 410 may generate a precharge signal PCG that is enabled after the end of a power-up operation. The command decoder 410 may generate an internal command ICMD, an internal strobe signal IST, and the precharge signal PCG, based on first to M-th command addresses CA<1:M> in synchronization with the clock CLK. The command decoder 410 may generate the internal command ICMD that is enabled when bits that are used as a command, among the first to M-th command addresses CA<1:M>, have a logic level combination for performing a write operation in synchronization with the clock CLK. The command decoder 410 may generate the internal strobe signal IST that is enabled after a time at which the internal command ICMD is enabled. The command decoder 410 may generate the precharge signal PCG that is enabled when the internal strobe signal IST is disabled. The command decoder 410 has been implemented to generate the internal command ICMD for performing a write operation, but may be implemented to generate various internal commands for performing various operations according to an embodiment. The power-up operation may be set as an operation of power supply voltage VDD that is supplied to the semiconductor device 40 rising from 0 V to the level of a target voltage. The command decoder 410 may be implemented to have the same circuit as the command decoder 210 illustrated in FIG. 9 and may perform the same operation as the command decoder 210 illustrated in FIG. 9, and thus a detailed description thereof is omitted.

The address decoder 420 may generate first to N-th internal addresses IADD<1:N> based on the first to M-th command addresses CA<1:M> in synchronization with the clock CLK. The address decoder 420 may generate the first to N-th internal addresses IADD<1:N> by decoding bits that are used as an address, among the first to M-th command addresses CA<1:M>, in synchronization with the clock CLK.

The data alignment circuit 430 may sequentially latch first to third data DATA<1:3> that are input in series. The data alignment circuit 430 may generate the first alignment data AD1, the second alignment data AD2, and the third alignment data AD3 by aligning the latched first to third data DATA<1:3>. The first alignment data AD1, the second alignment data AD2, and the third alignment data AD3 may be generated in parallel. The data alignment circuit 430 may be implemented by using a common deserializer.

The data input circuit 440 may precharge the first input and output line GIO1, the second input and output line GIO2, and the third input and output line GIO3 after the end of a power-up operation. The data input circuit 440 may precharge the first input and output line GIO1, the second input and output line GIO2, and the third input and output line GIO3 to the first logic level (i.e., a logic high level) when a precharge signal PCG is enabled after the end of the power-up operation. The data input circuit 440 may receive the first alignment data AD1, the second alignment data AD2, and the third alignment data AD3 after the start of a write operation. The data input circuit 440 may generate the first input data IND1, the second input data IND2, and the third input data IND3 by driving the first input and output line GIO1, the second input and output line GIO2, and the third input and output line GIO3 based on logic levels of the first alignment data AD1, the second alignment data AD2, and the third alignment data AD3 in synchronization with an internal strobe signal IST. The data input circuit 440 may be constructed as the same circuit as the data input circuit 310 that receives the first to third transfer data TD1, TD2, and TD3 illustrated in FIG. 13 and may perform the same operation as the data input circuit 310 in FIG. 13 except that the data input circuit 440 receives the first alignment data AD1, the second alignment data AD2, and the third alignment data AD3, and thus a detailed description thereof is omitted.

The data output circuit 450 may generate the first internal data ID1, the second internal data ID2, and the third internal data ID3 by receiving the first input data IND1, the second input data IND2, and the third input data IND3. The data output circuit 450 may generate the first internal data ID1, the second internal data ID2, and the third internal data ID3 based on logic levels of the first input data IND1, the second input data IND2, and the third input data IND3. The data output circuit 450 may generate the first internal data ID1, the second internal data ID2, and the third internal data ID3 each having a logic high level by driving a node that is included in the data output circuit 450 by first driving power when the first input data IND1, the second input data IND2, and the third input data IND3 have a logic low level after the start of a write operation. The data output circuit 450 may generate the first internal data ID1, the second internal data ID2, and the third internal data ID3 each having a logic low level by driving a node that is included in the data output circuit 450 by second driving power when the first input data IND1, the second input data IND2, and the third input data IND3 have a logic high level after the start of a write operation. The first driving power may be set as driving power that drives the first internal data ID1, the second internal data ID2, and the third internal data ID3 to a logic high level. The second driving power may be set as driving power that drives the first internal data ID1, the second internal data ID2, and the third internal data ID3 to a logic low level. The second driving power may be set as driving power smaller than the first driving power. The data output circuit 450 may be constructed as the same circuit as the data output circuit 320 illustrated in FIG. 13 and may perform the same operation as the data output circuit 320 illustrated in FIG. 13, and thus a detailed description thereof is omitted.

The semiconductor device 40 may drive the first input and output line GIO1, the second input and output line GIO2, and the third input and output line GIO3 to the first logic level (i.e., a logic high level) after the end of a power-up operation. The semiconductor device 40 may perform a write operation based on the first to M-th command addresses CA<1:M> in synchronization with the clock CLK. The semiconductor device 40 may generate the first alignment data AD1, the second alignment data AD2, and the third alignment data AD3 by latching and aligning the first to third data DATA<1:3> that are input in series after the start of a write operation. The semiconductor device 40 may generate the first internal data ID1, the second internal data ID2, and the third internal data ID3 by driving the first input and output line GIO1, the second input and output line GIO2, and the third input and output line GIO3 from each of which alignment data having the second logic level (i.e., a logic low level), among the first alignment data AD1, the second alignment data AD2, and the third alignment data AD3, are output after the start of a write operation. The semiconductor device 40 may store the first internal data ID1, the second internal data ID2, and the third internal data ID3 after the start of the write operation.

Figure 21:
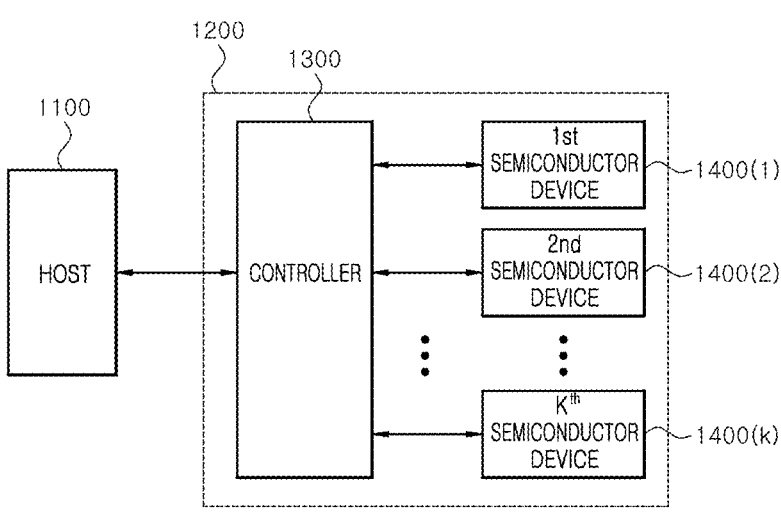
FIG. 21 is a diagram illustrating a construction according to an embodiment of an electronic system to which the semiconductor system illustrated in FIGS. 1 and 20 has been applied.

FIG. 21 is a block diagram illustrating a construction according to an embodiment of an electronic system 1000 according to an embodiment of the present disclosure. As illustrated in FIG. 21, the electronic system 1000 may include a host 1100 and a semiconductor system 1200.

The host 1100 and the semiconductor system 1200 may mutually transmit signals by using an interface protocol. The interface protocol that is used between the host 1100 and the semiconductor system 1200 may include a multi-media card (MMC), an enhanced small disk interface (ESDI), integrated drive electronics (IDE), peripheral component interconnect-express (PCI-E), advanced technology attachment (ATA), serial ATA (SATA), parallel ATA (PATA), a serial attached SCSI (SAS), a universal serial bus (USB).

The semiconductor system 1200 may include a controller 1300 and semiconductor devices 1400(1:K). The controller 1300 may control the semiconductor devices 1400(1:K) so that the semiconductor devices 1400(1:K) perform a write operation. The controller 1300 can prevent an error of the level transition of data, which is attributable to an interference phenomenon at a time at which data are toggled, by driving adjacent transmission lines to the same logic level prior to the time at which the data loaded onto the adjacent transmission lines are toggled. Each of the semiconductor devices 1400(1:K) can prevent an error of the level transition of data, which is attributable to an interference phenomenon at a time at which data are toggled, by driving adjacent input and output lines to the same logic level prior to the time at which the data loaded onto the adjacent input and output lines are toggled.

The controller 1300 may be implemented as the controller 10 illustrated in FIG. 1 or the controller 30 illustrated in FIG. 19. Each of the semiconductor devices 1400(1:K) may be implemented as the semiconductor device 20 illustrated in FIG. 1 or the semiconductor device 40 illustrated in FIG. 20. According to an embodiment, each of the semiconductor devices 1400(1:K) may be implemented as one of dynamic random-access memory (DRAM), phase change random-access memory (PRAM), resistive random-access memory (RRAM), magnetic random-access memory (MRAM), and ferroelectric random-access memory (FRAM).

What is claimed is:

1. A semiconductor system comprising:

a controller configured to drive first and second transmission lines to a first logic level after a start of an initialization operation and configured to output first and second data by driving the first and second transmission lines from each of which pre-data having a second logic level, among first and second pre-data, are output after a start of a write operation; and a semiconductor device configured to drive first and second input and output lines to the first logic level after an end of a power-up operation, configured to generate first and second internal data by driving the first and second input and output lines from each of which transfer data having the second logic level, among first and second transfer data that are generated from the first and second data, are output after the start of the write operation, and configured to store the first and second internal data.

2. The semiconductor system of claim 1, wherein the controller comprises:

a first transmitter configured to drive the first transmission line to the first logic level after the start of the initialization operation and configured to generate the first data by driving the first transmission line to the second logic level when the first pre-data has the second logic level after the start of the write operation; and a second transmitter configured to drive the second transmission line to the first logic level after the start of the initialization operation and configured to generate the second data by driving the second transmission line to the second logic level when the second pre-data has the second logic level after the start of the write operation.

3. The semiconductor system of claim 1, wherein the controller comprises:

a first transmitter configured to drive the first transmission line to the first logic level after the start of the initialization operation and configured to generate the first data by driving the first transmission line to the first logic level when the first pre-data has the first logic level after the start of the write operation; and a second transmitter configured to drive the second transmission line to the first logic level after the start of the initialization operation and configured to generate the second data by driving the second transmission line to the first logic level when the second pre-data has the first logic level after the start of the write operation.

4. The semiconductor system of claim 1, wherein logic levels of the first and second pre-data transition at a same time, and the first and second pre-data are input in parallel.

5. The semiconductor system of claim 1, wherein the semiconductor device comprises:

a reception circuit configured to generate the first and second transfer data by receiving the first and second data after the start of the write operation;

a data input and output circuit configured to drive the first and second input and output lines to the first logic level after the end of the power-up operation and configured to generate the first and second internal data by driving the first and second input and output lines from each of which transfer data having the second logic level, among the first and second transfer data, are output after the start of the write operation; and a memory circuit configured to store the first and second internal data in a memory cell that is selected based on an internal command and an internal address after the start of the write operation.

6. The semiconductor system of claim 5, wherein the reception circuit comprises:

a first receiver configured to generate the first transfer data by inverting and buffering the first data after the start of the write operation; and a second receiver configured to generate the second transfer data by inverting and buffering the second data after the start of the write operation.

7. The semiconductor system of claim 5, wherein the data input and output circuit comprises:

a data input circuit configured to drive the first and second input and output lines to the first logic level when a precharge signal is enabled and configured to generate the first and second internal data by driving the first and second input and output lines from each of which the transfer data having the second logic level, among the first and second transfer data, are output in synchronization with an internal strobe signal; and a data output circuit configured to generate the first and second internal data based on logic levels of the first and second input data.

8. The semiconductor system of claim 7, wherein the data input circuit comprises:

a first internal transmitter configured to drive the first input and output line to the first logic level when the precharge signal is enabled and configured to generate the first input data by driving the first input and output line to the second logic level when the first transfer data has the second logic level in synchronization with the internal strobe signal; and a second internal transmitter configured to drive the second input and output line to the first logic level when the precharge signal is enabled and configured to generate the second input data by driving the second input and output line to the second logic level when the second transfer data has the second logic level in synchronization with the internal strobe signal.

9. The semiconductor system of claim 7, wherein the data output circuit comprises:

a first internal receiver configured to generate the first internal data by driving a first node based on a logic level of the first input data; and a second internal receiver configured to generate the second internal data by driving a second node based on a logic level of the second input data.

10. The semiconductor system of claim 9, wherein the first internal receiver comprises:

a first pull-up driving element disposed between a power supply voltage and the first node and configured to drive the first node to a level of the power supply voltage when the first input data has the second logic level; and a first pull-down driving element disposed between the first node and a ground voltage and configured to drive the first node to a level of the ground voltage when the first input data has the first logic level.

11. The semiconductor system of claim 10, wherein:

the first pull-up driving element is further configured to generate the first internal data having the first logic level by driving the first node by first driving power when the first input data has the second logic level, and the first pull-down driving element is further configured to generate the first internal data having the second logic level by driving the first node by second driving power when the first input data has the first logic level.

12. The semiconductor system of claim 9, wherein the second internal receiver comprises:

a second pull-up driving element disposed between a power supply voltage and the second node and configured to drive the second node to a level of the power supply voltage when the second input data has the second logic level; and a second pull-down driving element disposed between the second node and a ground voltage and configured to drive the second node to a level of the ground voltage when the second input data has the first logic level.

13. The semiconductor system of claim 12, wherein:

the second pull-up driving element is further configured to generate the second internal data having the first logic level by driving the second node by first driving power when the second input data has the second logic level, and the second pull-down driving element is further configured to generate the second internal data having the second logic level by driving the second node by second driving power when the second input data has the first logic level.

14. The semiconductor system of claim 5, further comprising:

a command decoder configured to generate the internal command based on a command address in synchronization with a clock that is periodically toggled and configured to generate an internal strobe signal and a precharge signal that are enabled after the end of the power-up operation and after the start of the write operation; and an address decoder configured to generate the internal address based on the command address in synchronization with the clock.

15. The semiconductor system of claim 14, wherein the command decoder comprises:

an internal command generation circuit configured to generate the internal command that is enabled when the command address has a logic level combination for performing the write operation in synchronization with the clock;

an internal strobe signal generation circuit configured to generate the internal strobe signal that is enabled after a time at which the internal command is enabled; and a precharge signal generation circuit configured to generate the precharge signal that is enabled when a reset signal is enabled and that is enabled when the internal strobe signal is disabled after the end of the power-up operation.

16. The semiconductor system of claim 15, wherein the precharge signal generation circuit comprises:

a pulse generation circuit configured to generate an internal pulse that is enabled at a time at which the internal strobe signal is disabled; and a logic circuit configured to generate the precharge signal that is enabled when any one of the reset signal and the internal pulse is enabled.

17. A semiconductor system comprising:

a controller configured to output a clock and a command address and configured to output first and second data in series; and a semiconductor device configured to drive first and second input and output lines to a first logic level after an end of a power-up operation, configured to generate first and second alignment data by parallelizing first and second data based on the command address after a start of a write operation, configured to generate first and second internal data by driving the first and second input and output lines from each of which alignment data having a second logic level, among the first and second alignment data, are output, and configured to store the first and second internal data.

18. The semiconductor system of claim 17, wherein the semiconductor device comprises:

a data alignment circuit configured to sequentially latch the first and second data and configured to generate the first and second alignment data by aligning the latched first and second data;

a data input circuit configured to drive the first and second input and output lines to the first logic level when a precharge signal is enabled and configured to generate the first and second internal data by driving the first and second input and output lines from each of which alignment data having the second logic level, among the first and second alignment data, are output in synchronization with an internal strobe signal that is generated the command address; and a data output circuit configured to generate the first and second internal data based on logic levels of the first and second input data.

19. The semiconductor system of claim 18, wherein data input circuit comprises:

a first internal transmitter configured to drive the first input and output line to the first logic level when the precharge signal is enabled and configured to generate the first input data by driving the first input and output line to the second logic level when the first alignment data has the second logic level in synchronization with the internal strobe signal; and a second internal transmitter configured to drive the second input and output line to the first logic level when the precharge signal is enabled and configured to generate the second input data by driving the second input and output line to the second logic level when the second alignment data has the second logic level in synchronization with the internal strobe signal.

20. The semiconductor system of claim 18, wherein the data output circuit comprises:

a first internal receiver configured to generate the first internal data by driving a first node based on a logic level of the first input data; and a second internal receiver configured to generate the second internal data by driving a second node based on a logic level of the second input data.

21. The semiconductor system of claim 20, wherein the first internal receiver comprises:

a first pull-up driving element disposed between a power supply voltage and the first node and configured to drive the first node to a level of the power supply voltage when the first input data has the second logic level; and a first pull-down driving element disposed between the first node and a ground voltage and configured to drive the first node to a level of the ground voltage when the first input data has the first logic level.

22. The semiconductor system of claim 21, wherein:

the first pull-up driving element is further configured to generate the first internal data having the first logic level by driving the first node by first driving power when the first input data has the second logic level, and the first pull-down driving element is further configured to generate the first internal data having the second logic level by driving the first node by second driving power when the first input data has the first logic level.

23. The semiconductor system of claim 20, wherein the second internal receiver comprises:

a second pull-up driving element disposed between a power supply voltage and the second node and configured to drive the second node to a level of the power supply voltage when the second input data has the second logic level; and a second pull-down driving element disposed between the second node and a ground voltage and configured to drive the second node to a level of the ground voltage when the second input data has the first logic level.

24. The semiconductor system of claim 23, wherein:

the second pull-up driving element is further configured to generate the second internal data having the first logic level by driving the second node by first driving power when the second input data has the second logic level, and the second pull-down driving element is further configured to generate the second internal data having the second logic level by driving the second node by second driving power when the second input data has the first logic level.

* * * * *